(12) United States Patent
Sumant et al.

(10) Patent No.: US 9,561,526 B2
(45) Date of Patent: Feb. 7, 2017

(54) LOW FRICTION WEAR RESISTANT GRAPHENE FILMS

(71) Applicant: UCHICAGO ARGONNE, LLC., Chicago, IL (US)

(72) Inventors: Anirudha V. Sumant, Plainfield, IL (US); Diana Berman, Darien, IL (US); Ali Erdemir, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 78 days.

(21) Appl. No.: 14/309,366

(22) Filed: Jun. 19, 2014

(65) Prior Publication Data
US 2015/0367381 A1 Dec. 24, 2015

(51) Int. Cl.
*B05D 3/04* (2006.01)
*B05D 5/08* (2006.01)
*C10M 103/02* (2006.01)
*B81B 1/00* (2006.01)
*B05D 1/02* (2006.01)

(52) U.S. Cl.
CPC . *B05D 5/08* (2013.01); *B81B 1/00* (2013.01); *C10M 103/02* (2013.01); *B05D 1/02* (2013.01); *B05D 3/0453* (2013.01); *B05D 3/0486* (2013.01); *C10M 2201/0413* (2013.01)

(58) Field of Classification Search
USPC .................................................. 428/402, 408
See application file for complete search history.

(56) References Cited

U.S. PATENT DOCUMENTS

| 2013/0115462 A1* | 5/2013 | Mazyar | B22F 1/0022 428/403 |
| 2013/0126865 A1* | 5/2013 | Chiang | H01L 21/02378 257/48 |
| 2014/0291819 A1* | 10/2014 | Barth | H01L 23/53276 257/659 |

OTHER PUBLICATIONS

Yu et al "Graphene segregated on NI surfaces and trasnferrer to insulators" Apllied Physics Letters 93, 113103 (2008).*
Cumings and Zettl, "Low-Friction Nanoscale Linear Bearing Realized from Multiwall Carbon Nanotubes", Science, vol. 289, pp. 602-604, Jul. 2000.
Dienwiebel, et al., "Superlubricity of Graphite", Physical Review Letters, vol. 92, No. 12, pp. 126101-1-4, Mar. 2004.
Lee, et al., "Frictional Characteristics of Atomically Thin Sheets", Science, vol. 328, pp. 76-80, Apr. 2010.
Novoselov, et al., "Electric Field Effect in Atomically Thin Carbon Films", Science, vol. 306, pp. 666-669, Oct. 2004.

* cited by examiner

*Primary Examiner* — Archene Turner
(74) *Attorney, Agent, or Firm* — Foley & Lardner LLP

(57) ABSTRACT

A low friction wear surface with a coefficient of friction in the superlubric regime including graphene and nanoparticles on the wear surface is provided, and methods of producing the low friction wear surface are also provided. A long lifetime wear resistant surface including graphene exposed to hydrogen is provided, including methods of increasing the lifetime of graphene containing wear surfaces by providing hydrogen to the wear surface.

12 Claims, 18 Drawing Sheets

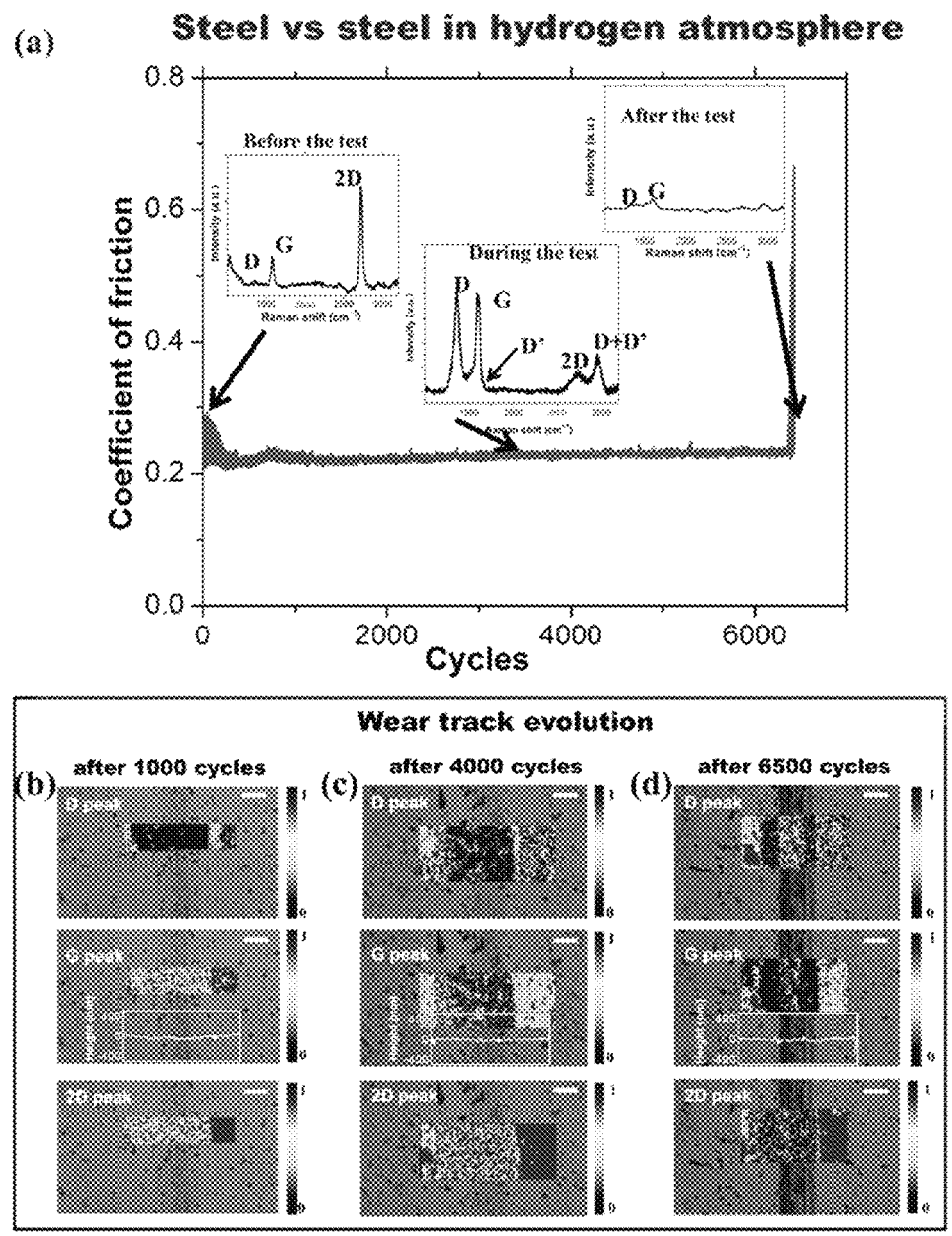
Figures 23(a)-(d)

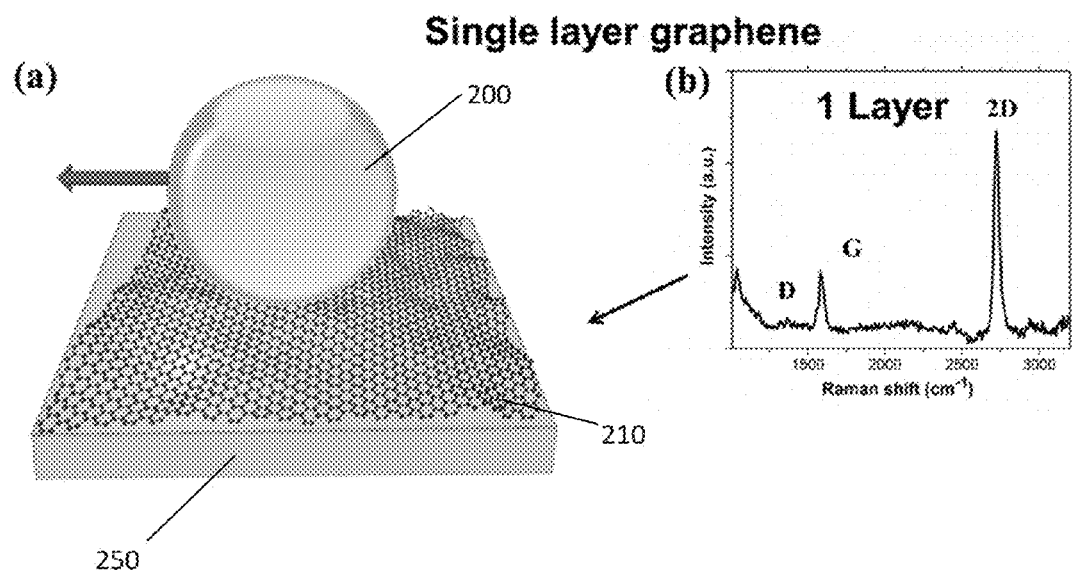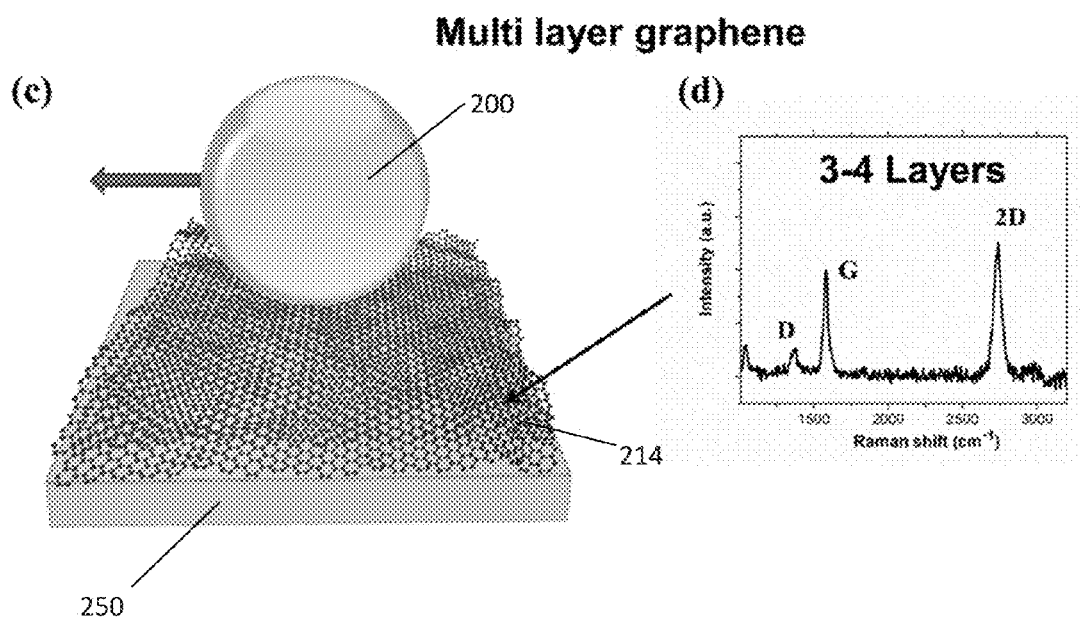
Figures 26a-26d

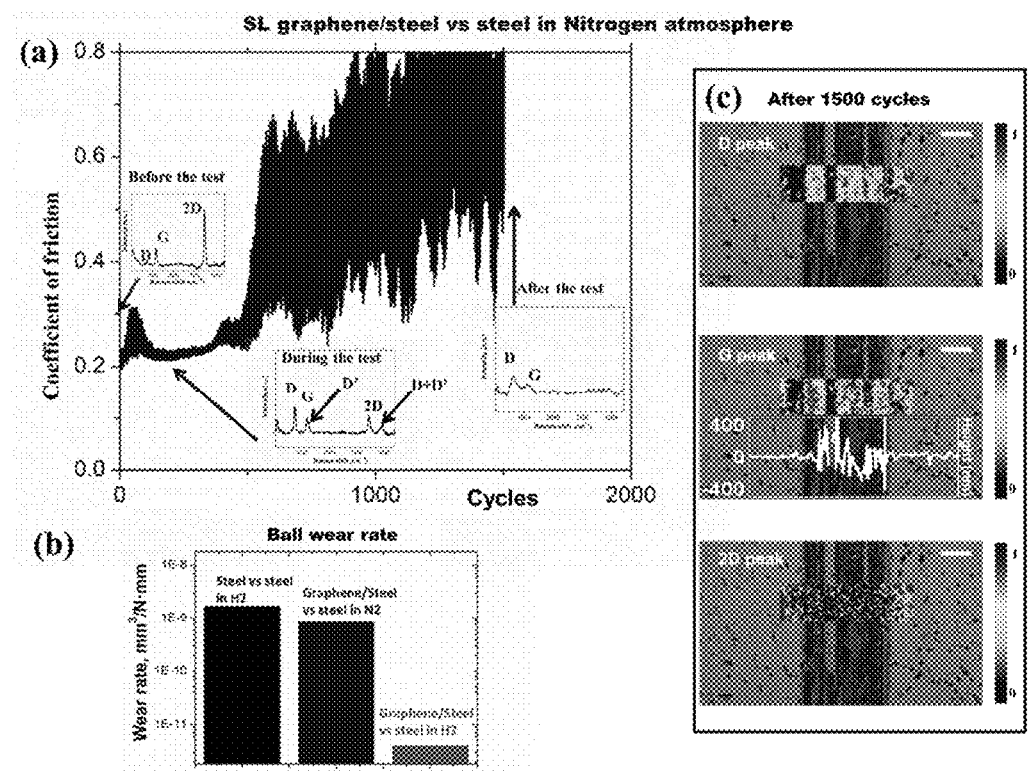
Figures 27(a)-(c)

LOW FRICTION WEAR RESISTANT GRAPHENE FILMS

STATEMENT REGARDING FEDERALLY SPONSORED RESEARCH

This invention was made with government support under Contract No. DE-AC02-06CH11357 awarded by the U.S. Department of Energy, Office of Science, Office of Basic Energy. The United States government has certain rights in this invention.

BACKGROUND

Understanding and controlling the root causes of friction have long been a tireless pursuit of mankind mainly because friction impacts our safety, mobility, and environment in so many ways. Accordingly, those scientists who study friction across many scales and engineers who design, manufacture, and operate moving mechanical assemblies (MMAs), like motored vehicles, have all aimed at drastically reducing or even totally vanishing friction or achieving superlubricity at engineering scales. The superlubric regime is attractive because it would provide the highest levels of savings in energy, environment, and money. Despite the development and use of many kinds of solid and liquid lubricants in recent years, superlubricity is seldom achieved at macro or engineering scales. Generally, friction coefficients of less than 0.01 are considered superlow, and hence fall in the superlubric regime. Such levels of friction coefficients are typical of those surfaces that are either aero- or hydro-dynamically separated or magnetically levitated where little or no solid-to-solid contact takes place. Under sliding regimes where direct metal-to-metal contacts prevail and high contact pressures are present, achieving superlubric friction coefficients (i.e., less than 0.01) is difficult due to the concurrent and often very complex physical, chemical, and mechanical interactions taking place at sliding surfaces.

In theory, computer simulations, and nano-scale experiments, the feasibility of superlubricity for certain atomically smooth crystalline solids that are in dry and incommensurate sliding contacts has been demonstrated. This effect, also called structural lubricity, was theoretically predicted in 1991 and later verified experimentally between two atomically smooth sliding surfaces of single crystal silicon and graphite materials. Recently, similar observations were made between the interwalls of two nested multiwalled carbon nanotubes. To enable superlubricity, atoms in these materials are oriented in a special manner and form an atomic hill-and-valley landscape, which looks like an egg-crate. When the two graphite surfaces are in registry (every 60 degrees), the friction force is high but when the two surfaces are rotated out of registry, the friction is nearly eliminated. By way of illustration, this effect is like two egg-crates which can slide over each other more easily when they are "twisted" with respect to each other. Since this effect is due to the incommensurability of lattice planes sliding against each other, the effect is restricted to material interactions at the nanoscales. At macro-scale, this structural effect, and hence superlubricity, is lost due to the structural imperfections and disorder caused by many defects. Superlubricity is very difficult to achieve at macro-scale tribological tests and mechanical systems.

During the past decade or so, many researchers have studied graphene's properties and determined that it has outstanding thermal, chemical, optical and mechanical properties. However, very little research has been done on exploring the tribological properties, and superlubricity in particular, of graphene. Graphene exhibits high chemical inertness, extreme mechanical strength, and easy shear property on its densely packed and atomically smooth surface. Since it is ultrathin, even with multi-layers, it may be applied onto MEMS/NEMS devices for operation and use at the oscillating, rotating and sliding contacts to reduce friction and wear.

Solid lubricants, such as, graphite, hexagonal boron nitride, molybdenum disulfide, and boric acid are traditionally used to combat friction and wear in a variety of moving mechanical assemblies. These lubricants may be applied as thin or thick solid coatings or burnished and sprayed onto surfaces to achieve lubricity. The durability or lifetime remains an important issue when long wear life is desired. In short, an important quandary with these pre-existing solid lubricants is how long the solid lubricant coatings will last. Additionally, in some specialty applications such as protective coatings for magnetic disc drives, in addition to low wear and friction characteristics, an extremely thin coating (down to nm or less) is an important.

Recent advances in the synthesis of graphene have resulted in several studies demonstrating the unique nanomechanical and nanotribological properties of single and few layer graphene. While some studies have recently demonstrated the potential of multi-layer graphene in pure or in additive form in substantially reducing wear and friction in mechanical systems, there are no reports on the tribological behavior of single or few layer graphene at macroscale.

SUMMARY

A method of forming a low friction wear surface is provided. The method may include disposing graphene over a substrate and disposing nanoparticles over the substrate.

A low friction wear surface is provided. The low friction wear surface may include a substrate, graphene disposed over the substrate and nanoparticles disposed over the substrate.

A method of increasing the wear resistance of a wear surface is provided. The method may include providing hydrogen to the wear surface. The wear surface may include a graphene layer disposed over a substrate.

A wear resistant surface is provided. The wear resistant surface may include a substrate, and a graphene layer disposed over the substrate. The graphene layer may be in the presence of hydrogen.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 23(a)-(d) depict, respectively, the coefficient of friction as a function of test cycles for a graphene coated sample in a hydrogen atmosphere with the insets showing the characteristic Raman signatures of the wear track at different times in the test, the wear track evolution of the graphene coated sample after 1,000 test cycles with the insets showing the characteristic Raman signatures, the wear track evolution of the graphene coated sample after 4,000 test cycles with the insets showing the characteristic Raman signatures, and the wear track evolution of the graphene coated sample after 6,500 test cycles with the insets showing the characteristic Raman signatures in one embodiment.

FIGS. 26(a)-(d) depict, respectively a schematic representation of the experimental setup for a transferred single layer of graphene on steel, a Raman spectra of the single layer of graphene on steel, the experimental setup for a multi-layer graphene on steel and a Raman spectra of the multi-layer graphene on steel in one embodiment.

FIGS. 27(a)-(c) depict, respectively, the coefficient of friction as a function of time for a single layer of graphene on steel against steel in a dry nitrogen environment with the insets showing typical Raman spectra from the wear track at various times of the test, the ball wear rate for a single layer of graphene on steel against steel in a dry nitrogen environment and the wear track after 1,500 cycles with the chemical state of graphene in the wear track presented by peak mapping in one embodiment.

DETAILED DESCRIPTION

Following below are more detailed descriptions of various concepts related to, and embodiments of, inventive low friction and wear resistant graphene containing surfaces. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Nanoparticle Enabled Superlubricity

The macro-scale superlubricity of graphene has been observed. The superlubricity was achieved in a system including graphene with two other carbon materials, such as nanodiamond and diamond like carbon (DLC) at the sliding contact interface of a ball on disk system. This discovery may represent a major development in the lubrication field and may have significant scientific and technological implications in the future. Superlubricity may be defined as a regime of motion in which friction vanishes or nearly vanishes, such as a COF of less than about 0.01.

Superlubric friction levels have been observed for graphene on a $SiO_2$ substrate sliding against a DLC ball in a dry environment. As utilized herein, a dry environment is an environment with less than 1% humidity. The substrate may minimize the effect of the underlying surface allowing the observation of the actual friction of graphene layers. Conversely, when tested in humid environment, both the coefficient of friction (COF) and wear of the graphene were high. A graphene layer sliding against DLC without a nanoparticle supply achieved a COF as low as 0.03. A layer of nanoparticles alone, without graphene, in a dry nitrogen environment sliding against DLC exhibited high friction and rapid wear of surfaces. The addition of nanoparticles to the graphene layer on the substrate produces a near-zero COF— such as about 0.004. The graphene may be introduced onto the surface by spraying a graphene-containing ethanol solution over the surface and then evaporating the ethanol. Therefore, no chemical vapor deposition (CVD) or other types of preparation steps are required and the graphene application procedures are simple and may be adopted easily for practical applications. For example, the simple procedure may be used to lubricate silicon-based MEMS.

Figure 1:
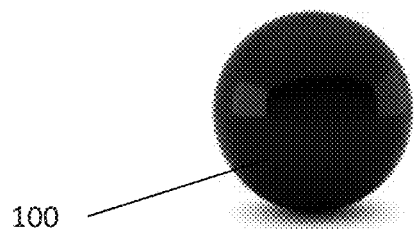
FIG. 1 depicts a diamond like carbon coated stainless steel ball in one embodiment.
Figure 2:
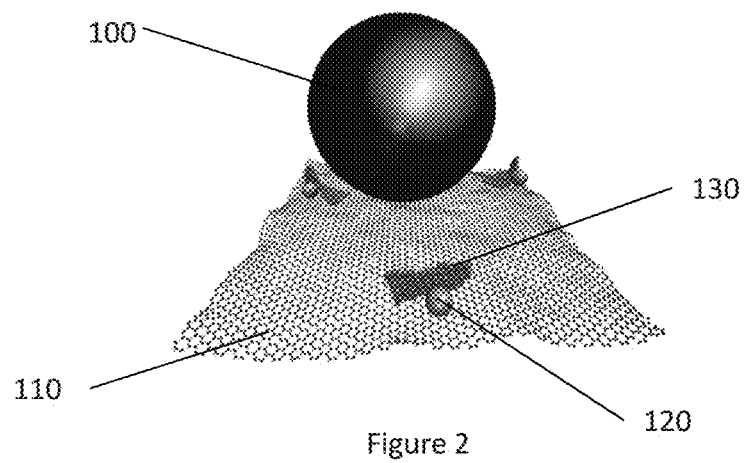
FIG. 2 is a schematic depiction of a wear resistance and coefficient of friction testing arrangement in one embodiment.

The superlubric friction is measured by sliding the graphene against a ball with a DLC surface. A ball with a DLC surface 100 is shown in FIG. 1. As shown in FIG. 2, the surface producing superlubric friction against a ball with a DLC surface 100 may include a graphene layer 110, graphene segments 130 and nanoparticles 120 disposed over a substrate. The graphene layer 110 may be disposed between the substrate and the graphene segments 130.

The nanoparticles may be formed of any suitable material. According to one embodiment, the nanoparticles may include diamond or nickel. The nanoparticles may be any suitable size. According to one embodiment, the nanoparticles may have a size of about 2 nm to about 10 nm, such as about 3 to about 5 nm. The size of the nanoparticles may refer to a diameter of the nanoparticles.

The graphene layer 110 may be disposed over a substrate 150. The substrate may be any suitable material. According to one embodiment, the substrate may include at least one of a metal, a transition metal and an insulator. The substrate may be silicon, $SiO_2$ or silicon with a $SiO_2$ surface layer. The substrate may include a surface film including a metal, such as nickel. According to another embodiment, the substrate may include at least one of silicon nitride, aluminum oxide, and sapphire.

An exemplary embodiment of the low friction wear surface may include a graphene and diamond nanoparticle layer sliding against a DLC surface. In the case of the DLC-graphene and diamond nanoparticle tribopair sliding in a humid environment, both the COF and wear may be large. More importantly, a large amount of the DLC coating on the ball may be transferred to the wear track of the substrate in the form of loose graphitic flakes. The substrate itself may suffer wear during sliding in a humid environment. Moreover, in a humid environment the diamond nanoparticles may increase the wear of both the DLC ball and the substrate, by producing more intense rubbing. As shown in FIG. 3(*a*) the COF for the humid environment has a high value of about 0.2. The wear track on the substrate sliding in a humid environment is large as shown in FIG. 3(*b*), and the wear track exhibits a Raman signature typical of DLC and disordered carbon. The wear scar on the ball sliding in a humid environment is large and passes through the DLC up to a steel ball core, as shown in FIG. 3(*c*), with the inset showing the depth of the wear scar. FIG. 3(*d*) provides a schematic representation of the sliding experimental setup.

By contrast, the DLC-graphene and diamond nanoparticle tribopair sliding in a dry nitrogen environment, both the COF and wear may be small. In case of dry nitrogen environment the COF may reach a value of about 0.004, within the superlubricity regime, as shown in FIG. 3(*d*). As shown in FIG. 3(*f*), the wear track on substrate sliding in the dry environment is small, and exhibits a Raman signature typical of defected graphene. The wear scar on the ball sliding in the dry environment is small, as shown in FIG. 3(*g*), and is consistent with a wear scar produced by the Hertz contact pressure during sliding. The inset cross-section of the 3D profilometer image in FIG. 3(*g*) indicates no measurable wear of the DLC surface of the ball. No DLC transfer from the ball surface to the wear track was observed in the dry environment.

Figure 4:
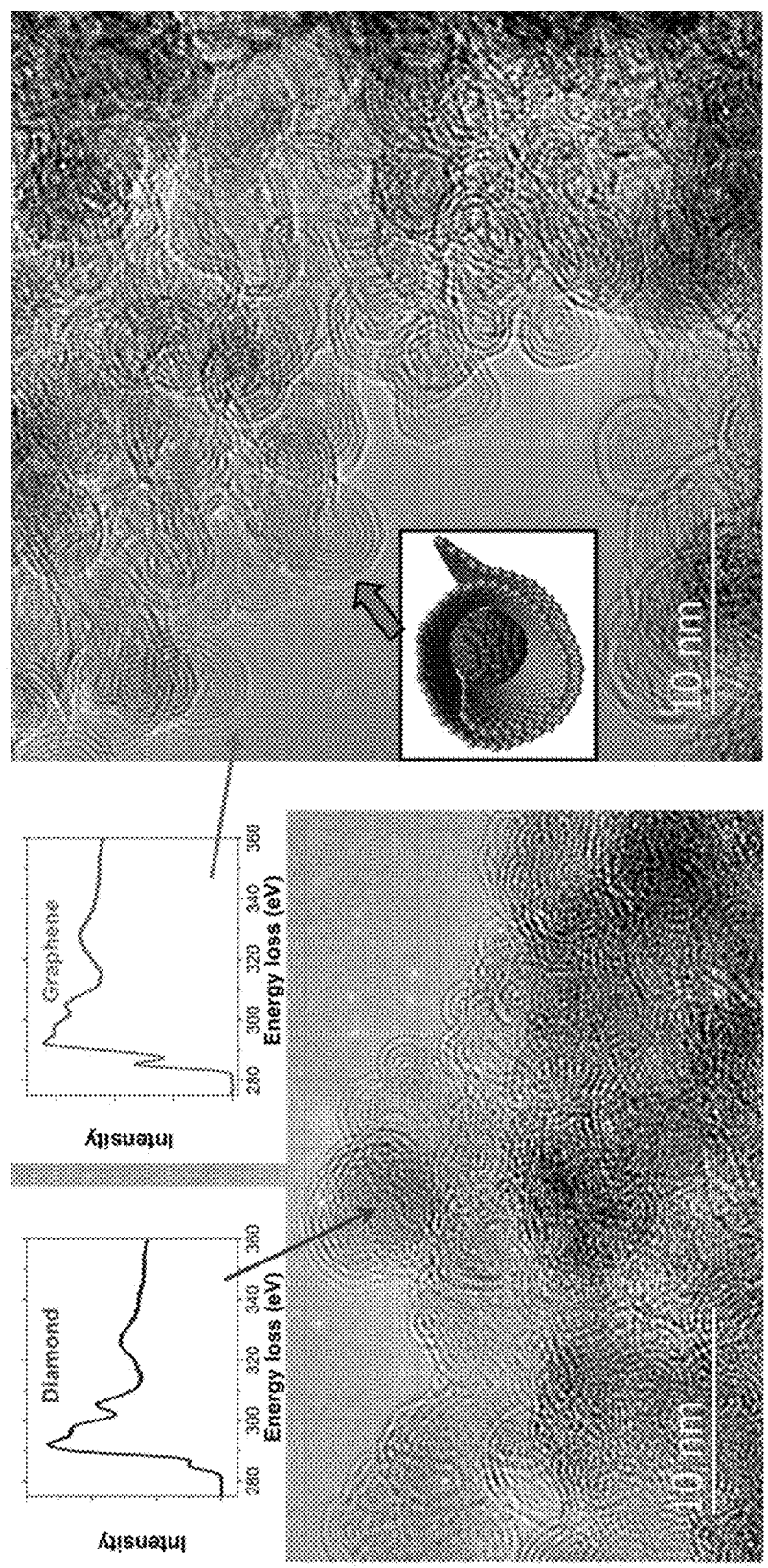
FIG. 4 depicts TEM images of the debris produced after testing a graphene and diamond nanoparticle coating in a dry environment in one embodiment.

A detailed exploration of the wear track formation showed that the wear debris produced by sliding in a dry environment are graphene scrolls with diamond nanoparticles occurring in some of the graphene scrolls. The formation of the graphene scrolls containing diamond nanoparticles may correlate to a reduction in COF to the superlubricity regime. The TEM analysis shown in FIG. 4 indicates that the wear debris at the wear track produced during sliding in a dry environment is in the form of graphene scrolls, and that at least some of the graphene scrolls contain diamond nanoparticles. The peak at 285 shown in the inset of FIG. 4 is related to the linear structure of the carbon material, and is lower for graphene scrolls containing diamond nanoparticles and should not exist for pure diamond, for pure graphene this peak is higher. The peak at 293 is present for all carbon materials. The random orientation of scrolls including the diamond nanoparticles necessitates multiple orientations to clearly image the diamond lattice and graphene layers, as a result some of the scrolls shown in FIG. 4 in which diamond nanoparticles are not visible may include diamond nanoparticles.

Figure 5:
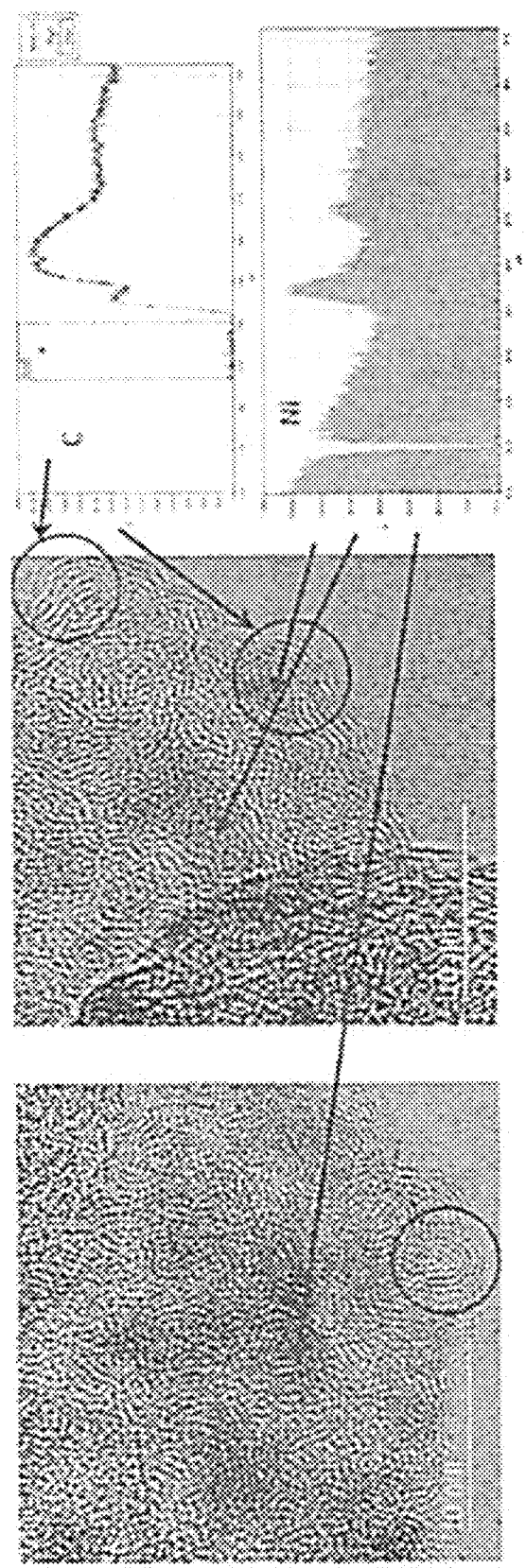
FIG. 5 depicts TEM images of the debris produced after testing a graphene and nickel nanoparticle coating in a dry environment in one embodiment.

According to another embodiment, a DLC and graphene/nickel nanoparticle tribopair is subjected to sliding in a dry environment. As shown in FIG. 5, graphene scrolls are formed around the nickel nanoparticles, with the inset plots indicating that the graphene scrolls contain both graphene and nickel nanoparticles. The formation of the graphene scrolls containing nickel nanoparticles may correlate to a reduction in COF to the superlubricity regime.

Molecular dynamic (MD) simulations indicate that diamond nanoparticles (NP) may activate and guide the folding of initially planar graphene patches. During sliding in a dry environment, graphene tends to form scrolls, reducing the contact area and producing a low friction state. The diamond NPs may facilitate and guide the scroll formation by overcoming the potential barriers associated with graphene deformation. Without being bound by any particular theory, the graphene scrolls may be formed by two different mechanisms. In a first formation mechanism, graphene platelets are highly reactive and may readily attach to the dangling bonds in diamond nanoparticles initiating graphene scroll formation. During the initial sliding regime graphene flakes may be torn, producing smaller graphene platelets with reactive edges which further facilitate scroll formation. In a second formation process, during the sliding process the graphene patches encounter the 3-D structure of diamond nanoparticles, which acts as an obstruction. Based on the relative binding energetics between graphene-DLC and graphene-diamond, it may be preferable for the graphene to wrap around the nanoparticles to promote higher surface contact and form graphene scrolls. Once in a scrolled state, the final structures of graphene on diamond are well coordinated and stable.

Figures 7A, 7B:
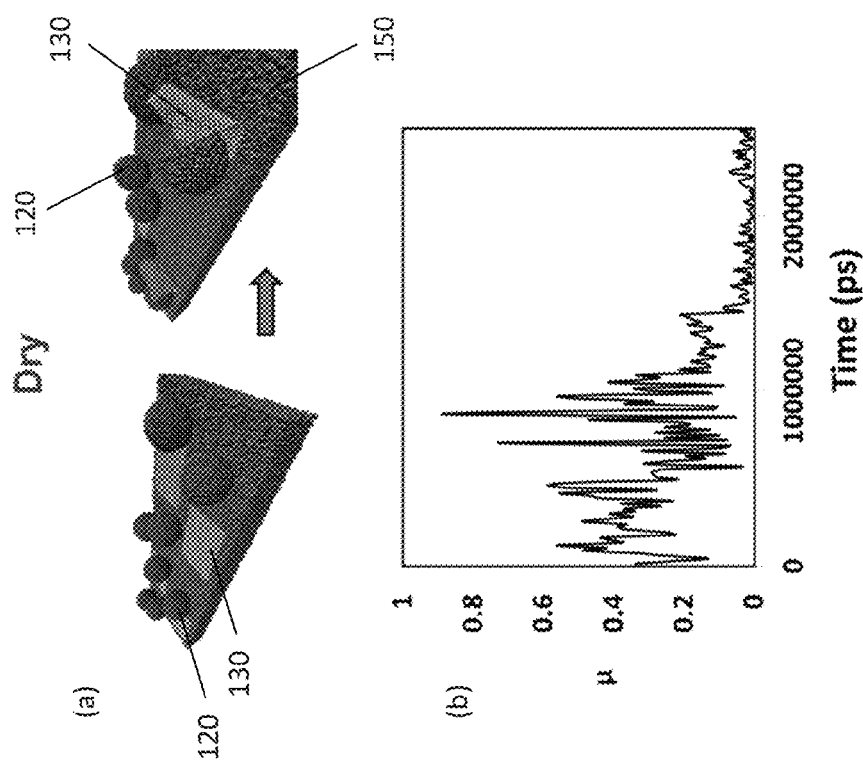
FIGS. 7(a) and 7(b) depict, respectively, a schematic representation of the effect of a test of a graphene and diamond nanoparticle coating in a dry environment and the coefficient of friction as a function of test time of the coating in one embodiment.

The scrolling of graphene sheets over diamond NPs impacts the nanoscale and macroscale tribology. At the nanoscale, MD simulations of the temporal evolution of the coefficient of friction indicate that the formation of individual graphene scrolls alters the coefficient of friction. FIG. 7(b) shows the evolution of COF at the nanoscale for a single graphene patch in dry environment with the passage of time. At the beginning of the simulation (t<1.0 ns), COF values in the range of about 0.4-0.2 are observed. This data coincides with the initial graphene patches 130 being in an extended or unscrolled state, as schematically shown in FIG. 7(a). Scroll formation due to wrapping of graphene sheets over diamond NPs is initiated at a time of about 1.2 ns, at which time the COF values begin to drop significantly to the superlubric regime. Beyond a time of 1.2 ns, the COF values remain in the superlubric regime. Once formed, the scrolls slide against randomly arranged DLC atoms which due to the amorphous nature of the DLC acts as an incommensurate surface lattice structure at the interface. This produces a constant out-of-registry sliding, which produces a COF in an ultra-low friction regime. Furthermore, in accordance with Amonton's law, the simulated COF depends on the contact area between formed graphene scrolls and the DLC surface even at the nanoscale. The observed reduction in COF values may be attributed to a reduction in interfacial contact area between DLC and the graphene scrolls and the incommensurability between the DLC and graphene nanoscrolls.

Figures 3A, 3B, 3C, 3D, 3E, 3F, 3G:
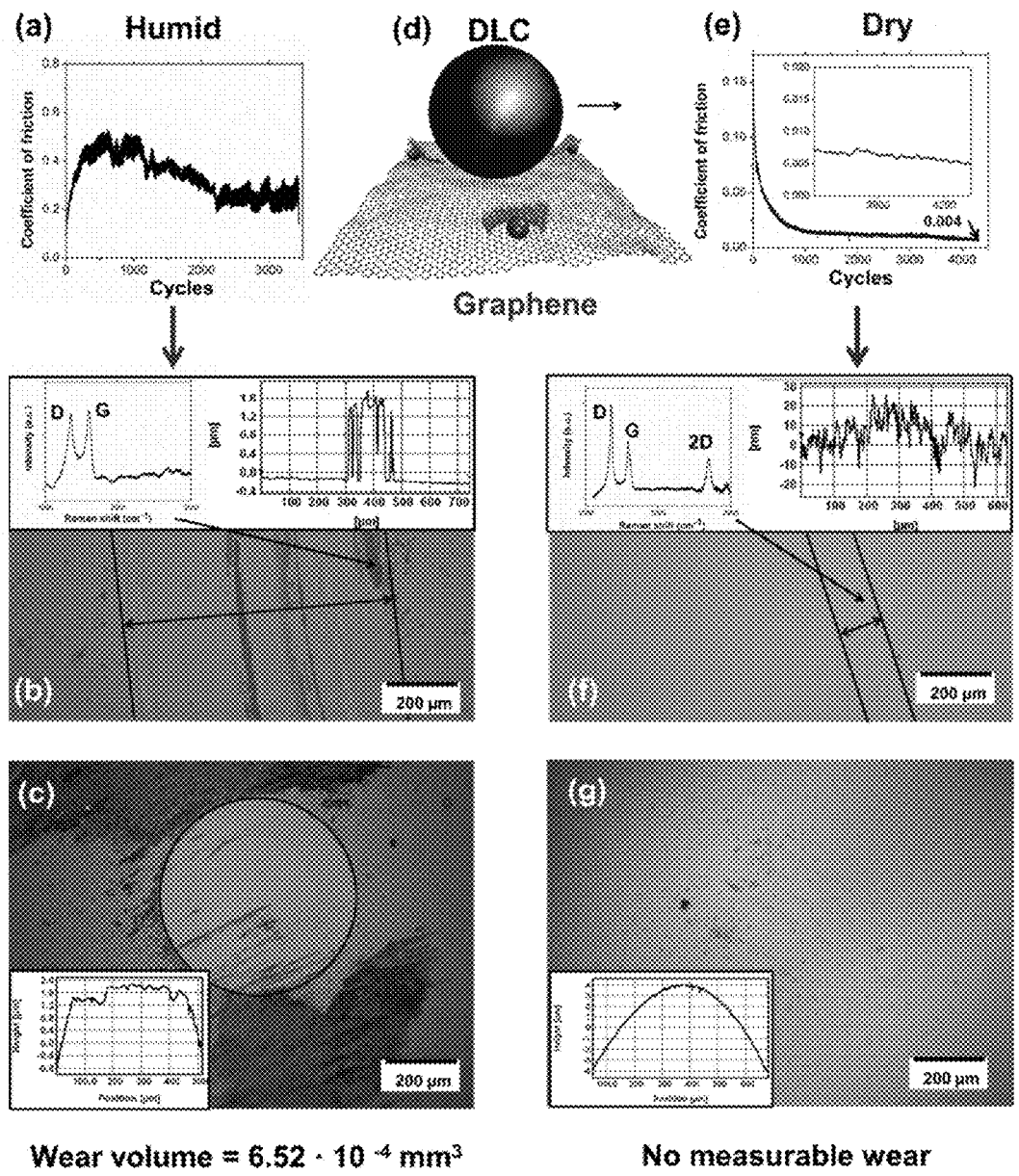
FIGS. 3(a)-(g) depict, respectively, a plot of the coefficient of friction as a function of test cycles for graphene and diamond nanoparticle coating in a humid environment, wear on the ball in a humid environment, wear on the substrate surface in a humid environment, a schematic representation of the test arrangement, a plot of the coefficient of friction as a function of test cycles for graphene and diamond nanoparticle coating in a dry environment, wear on the ball in a dry environment and wear on the substrate surface in a dry environment in one embodiment.
Figures 6A, 6B:
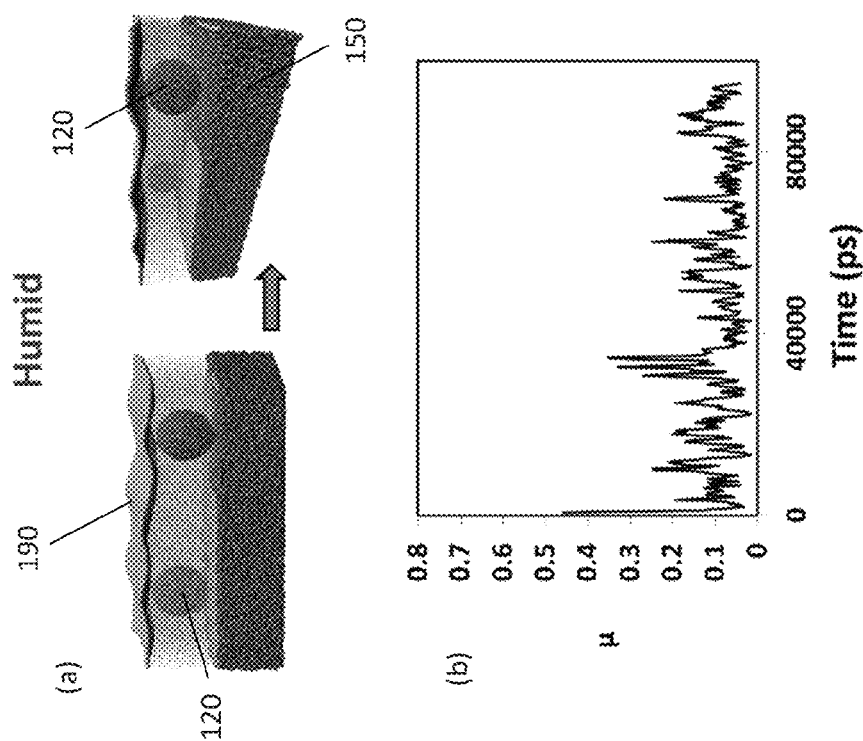
FIGS. 6(a) and 6(b) depict, respectively, a schematic representation of the effect of a test of a graphene and diamond nanoparticle coating in a humid environment and the coefficient of friction as a function of test time of the coating in one embodiment.

As shown in FIG. 6, MD simulations indicate that sliding of a graphene and nanoparticle surface against DLC in a humid environment does not result in the same behavior observed in a dry environment. The presence of nanoparticles in humid environment may increase the friction and wear of the ball as graphene layers remain strongly attached on the surface. The MD trajectory shown in FIG. 6(b) traces the dynamical evolution of COF with water present between the nanoscopic contacts—the DLC and graphene sheets. The water present between the sliding interfaces forms quasi two-dimensionally ordered layers, as shown in FIG. 6(a). These water layers 190 may prevent the scrolling of graphene onto the diamond NPs. The lack of graphene scrolls produces a tribological state that is markedly different from that of the dry environment. Additionally, during sliding, the ordered two-dimensional water layers present a constant energy barrier for the DLC to overcome. The combination of these two effects may result in little or no friction variation over time, as shown in FIG. 3(b), and a nearly constant high COF condition of about 0.1 maintained over the entire length of the simulation time.

At the molecular level, the observed superlubricity between the DLC and scrolled graphene may be a result of graphene's nanoscopic anisotropic crystal structure that includes strong covalent intra-layer bonding and weaker dispersive interlayer interactions. As a consequence of this unique structural contact between an incommensurate DLC surface and the graphene scrolls, DLC may slide on top of the underlying graphene sheets by overcoming relatively small energetic barriers. Recent experiments have indicated that nanoscale friction between a graphene flake and a graphite surface is a function of the misfit angle between the two surfaces. The observed reduction in friction forces to vanishingly small values may depend on the degree of commensurability between the lattices of the flake and the extended surface. In an incommensurate state, the unit-cells in contact have to overcome much smaller barriers at any point in time compared to unit-cells in a commensurate state producing a considerably reduced resistance towards sliding.

Furthermore, the friction force may depend linearly on the number of atoms that chemically interact across the contact. The effective contact between the graphene sheets and DLC may decrease with time as the graphene scrolls are formed. Since friction may be controlled by short-range chemical interactions even in the presence of dispersive forces, the reduction in nanoscopic contact due to graphene scroll formation may be significant enough to produce a superlubric state.

Figure 8:
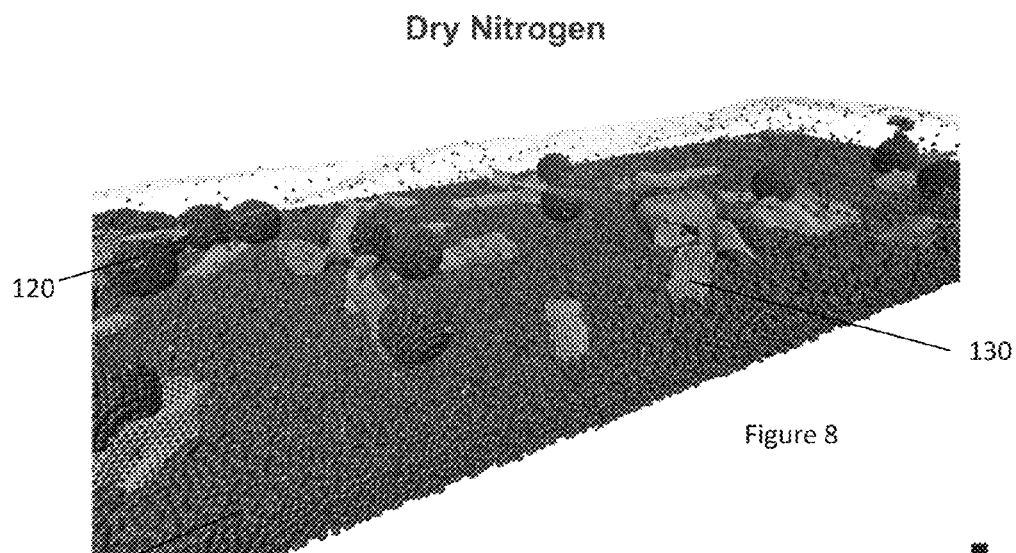
FIG. 8 depicts a schematic representation of the effect of a test of a graphene and diamond nanoparticle coating in a dry nitrogen environment in one embodiment.
Figure 9:
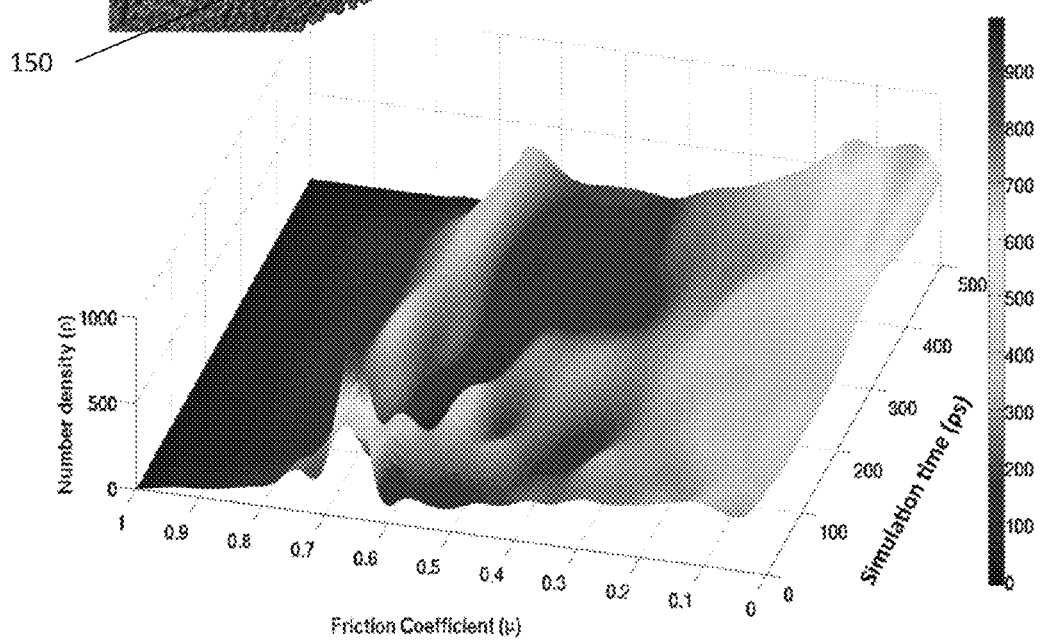
FIG. 9 depicts the number density of graphene scrolls and friction coefficient as a function of simulation time for a graphene and diamond nanoparticle coating in one embodiment.

Large scale MD simulations demonstrating the time evolution of the distribution of COF values were conducted. A schematic representation of the mesoscopic graphene scroll formation around diamond NPs for an ensemble of graphene patches when subjected to sliding is shown in FIG. 8. At the mesoscale, the collective scrolling behavior of many individual graphene patches and a density distribution of their tribological state is created to assess their contribution to the observed friction. The temporal evolution of the distribution of the COF averaged over an ensemble of graphene patches is shown in FIG. 9. The density distribution of COF values shows a narrow distribution with a peak in the range of about 0.6-0.7 indicating that the system overall is in a state of high friction. At the start of the simulation, t=0, most of the patches are sheet-like and are in close contact with the interface producing a high contact area between the patch and the DLC.

Figure 10:
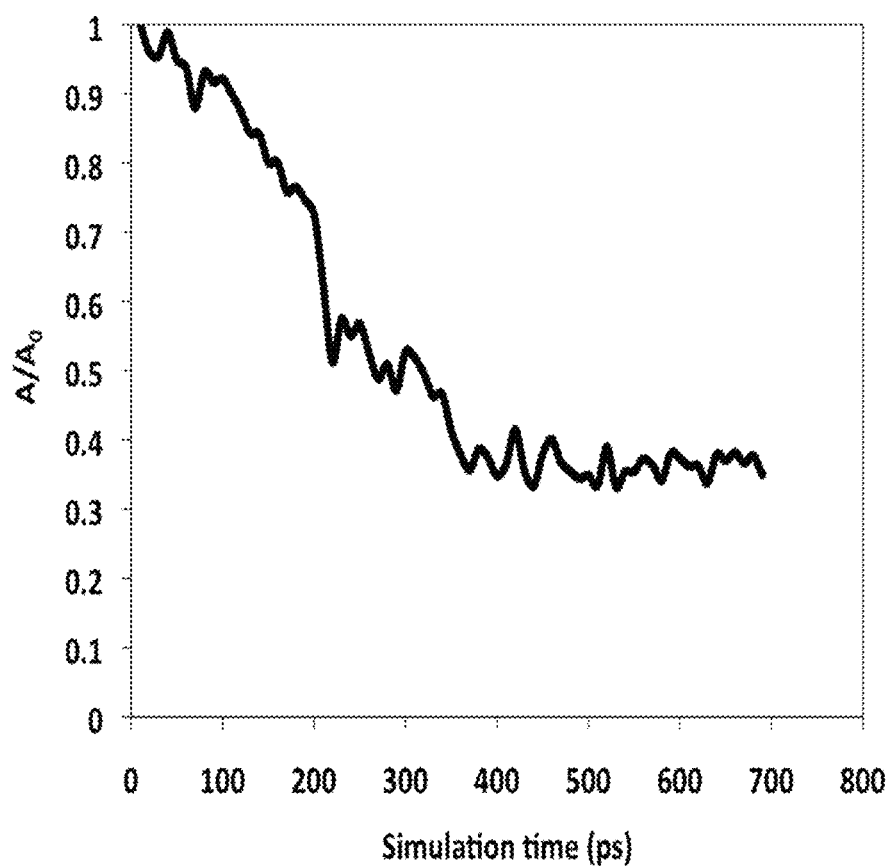
FIG. 10 depicts the evolution of the ratio of the surface area of graphene patches to the original surface area of the graphene patches as a function of simulation time in one embodiment.

As time passes, t in the range of about 200-300 ps, more and more graphene patches are seen to wrap around diamond NPs to form graphene scrolls, producing a corresponding reduction in the peak intensity. The density profile shows a broader distribution and shifts prominently towards lower COFs, $\mu$ less than about 0.2. Sliding of the DLC may be associated with an increase in the probability of graphene scroll formation leading to a decrease in the average contact area, as shown in FIG. 10 which depicts the normalized contact area as a function of sliding time, with the normalized contact area at t=0 about 1. The contact area may be proportional to the number of interacting atoms, and may be reduced by about 40-50% during the 200-300 ps time period.

The ensemble averaged COF shifts to the superlubric regime, μ less than about 0.01, at about t=500 ps when most of the graphene patches are in a scrolled state. The time evolution of the COF distribution demonstrates that increased graphene scroll formation with time manifests in the form of macroscopic superlubricity. The effective contact area of the system when in a superlubric state is reduced by about 65-70% as compared to t=0.

Drawing analogies to single vs. multiple asperity behavior, the tribological evolution of a single graphene patch at the nanoscale resembles that of a single asperity contact whereas the mesoscopic behavior resembles a multiple asperity contact. While the friction laws at the mesoscale are not different from that at the nanoscale, there is a marked shift in dynamical evolution. The COF for a single patch reaches a superlubric state at about 1.2 ns, whereas the mesoscopic system takes about 500 ps to reach the same COF regime. The initial tribological state of the patches as well as the configuration of the patch vs. diamond NPs may influence the dynamics of scroll formation, which may in turn affect the dynamical evolution of the COF for the mesoscopic system. The macroscopic contact in the experiments may be envisioned as including a large number of smaller contacts or asperities, which explains the difference in the time for the onset of the superlubric state in the experimental vs. simulated systems. Despite the complex nanoscopic process of scroll formation, the MD simulation data indicates that the macroscopically observed linear relationship between friction force and contact area holds true at both the meso and nanoscale.

Figure 11:
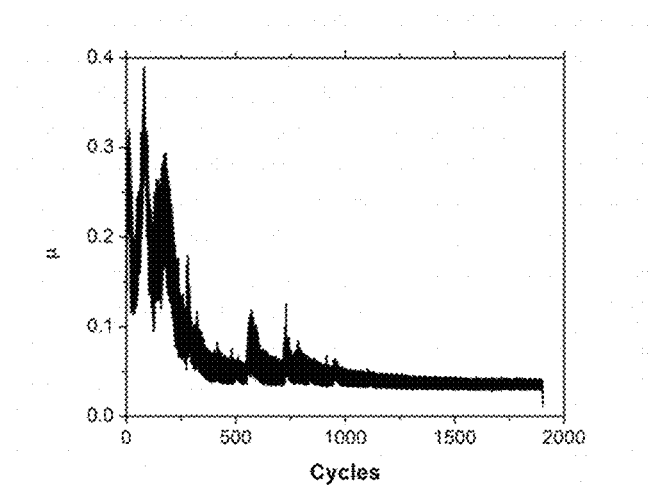
FIG. 11 depicts the coefficient of friction of graphene on a $SiO_2$ substrate in contact with diamond like carbon as a function of test cycles in one embodiment.
Figure 12:
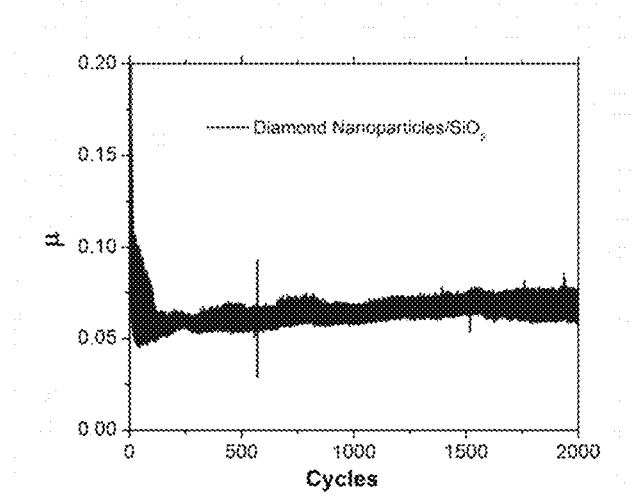
FIG. 12 depicts the coefficient of friction of diamond nanoparticles on a $SiO_2$ substrate in contact with diamond like carbon as a function of test cycles in one embodiment.
Figure 13:
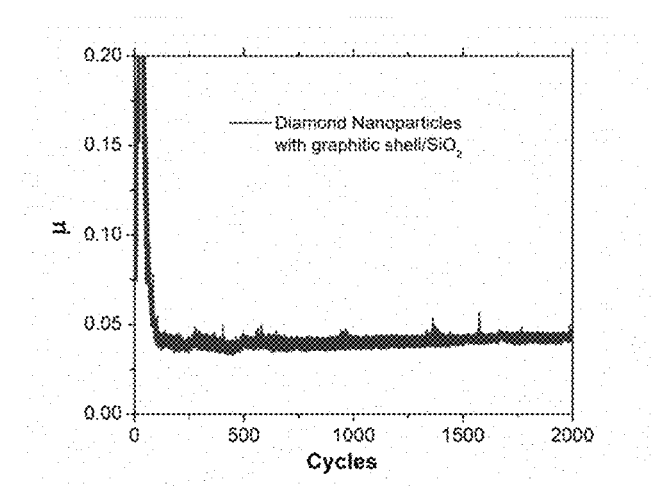
FIG. 13 depicts the coefficient of friction of graphene with diamond nanoparticles on a $SiO_2$ substrate in contact with diamond like carbon as a function of test cycles in one embodiment.

The synchronistic effect of the nanoparticles on the graphene scrolls was investigated by comparison to other wear surfaces including graphene and/or nanoparticles in sliding contact with a DLC surface. As shown in FIG. 11, graphene on a $SiO_2$ substrate in the absence of nanoparticles did not exhibit superlubric behavior. The graphene scrolls may not be stable enough in the absence of nanoparticles to effectively reduce the COF to the superlubric regime. A wear surface including diamond nanoparticles disposed on a $SiO_2$ substrate in the absence of graphene produced a high COF and wear as shown in FIG. 12. The dangling bonds of the diamond nanoparticles may attach to carbon atoms of the DLC surface, producing a high COF. A wear surface including diamond nanoparticles with a rigidly attached graphitic shell formed during annealing disposed on a $SiO_2$ substrate produced a COF higher than the COF of the graphene scrolls including diamond nanoparticles, as shown in FIG. 13. The rigidly attached graphitic shell may negatively impact the ease of sliding.

Figure 14:
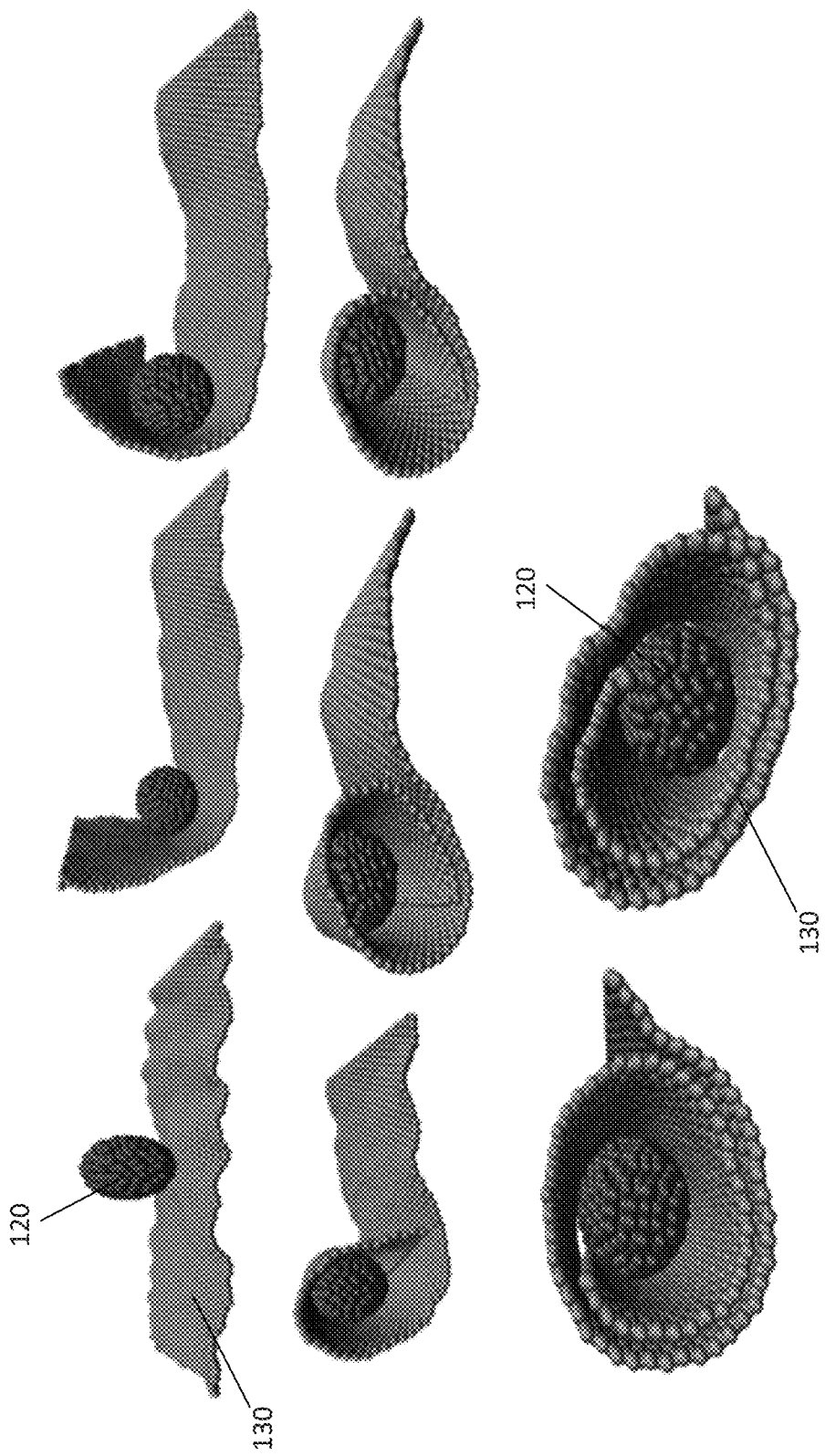
FIG. 14 depicts a schematic representation of the sequential wrapping of a graphene patch around a diamond nanoparticle in one embodiment.

The manner in which graphene patches may wrap around nanoparticles to form graphene scrolls is depicted in FIG. 14. The graphene patch 130 may wrap around the nanoparticle 120 when sliding occurs to form graphene scrolls with nanoparticles at the center of the scrolls. The graphene patch 130 may wrap around the nanoparticle 120 more than once. According to one embodiment, the graphene scrolls may be multiwalled or multilayered. More than one graphene patch may be included in a graphene scroll.

Figure 16:
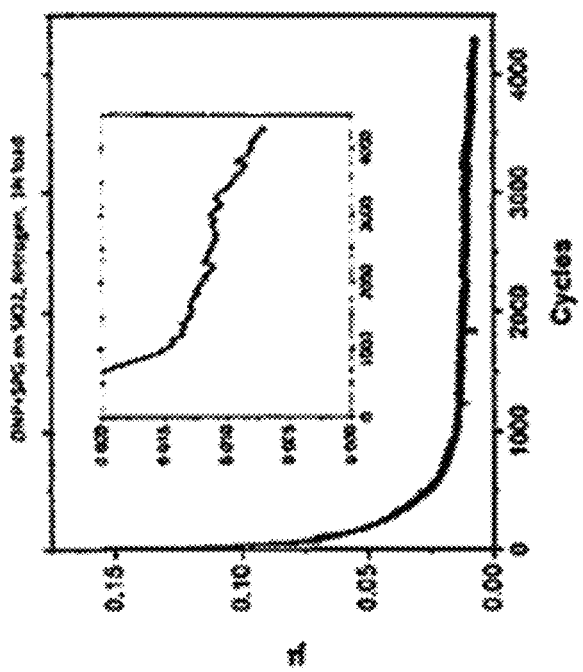
FIG. 16 depicts a pin-on-disc friction coefficient measurement of a solution processed graphene film with diamond nanoparticles deposited on a $SiO_2$ substrate as a function of time and the inset depicts a magnified view of the lowest average coefficient of friction in one embodiment.
Figure 15:
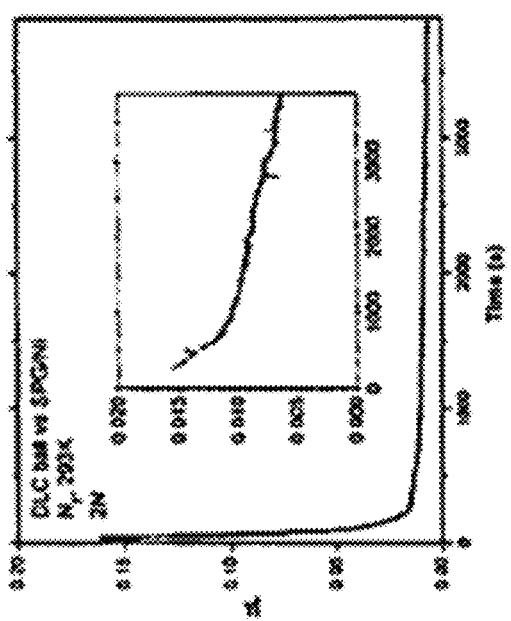
FIG. 15 depicts a pin-on-disc friction coefficient measurement of a solution processed graphene film deposited on a Ni thin film as a function of time and the inset depicts a magnified view of the lowest average coefficient of friction in one embodiment.

FIGS. 15 and 16 depict the COF as a function of time for a solution processed graphene film deposited on a nickel thin film substrate and a solution processed graphene with diamond nanoparticles deposited on a $SiO_2$ substrate, respectively, in a pin-on-disc measurement. The insets of FIGS. 15 and 16 show a magnified view of the friction plot detailing the lowest measured average COF of about 0.005.

The low friction wear surface including graphene and nanoparticles may be produced by any appropriate process. According to one embodiment, the process may include disposing graphene over a substrate and disposing nanoparticles over the substrate. The process may be carried out at atmospheric pressures and temperatures. The disposing of the graphene over the substrate may be achieved by any suitable process, such as a solution processed graphene (SPG) method.

The SPG may be obtained by exfoliating graphene and disposing the resulting graphene flakes in a liquid. The graphene may be exfoliated by any appropriate chemical or mechanical exfoliation process, such as chemical exfoliation of highly oriented pyrolytic graphite. The liquid may be any compatible liquid, such as water, alcohol or a hydrocarbon based solvent. The SPG may be disposed over the substrate by spraying the solution containing the graphene flakes on the substrate and evaporating the liquid.

The disposing of the nanoparticles may be achieved by any suitable process. According to one embodiment, the nanoparticles may be disposed in a compatible liquid, such as water, alcohol or a hydrocarbon based solvent. The nanoparticles in liquid may be sprayed on the substrate and the liquid evaporated to dispose the nanoparticles over the substrate. The nanoparticles may be included in the same liquid as the graphene flakes, and disposed over the substrate at the same time as the graphene. Alternatively, the nanoparticles may be disposed over the substrate before or after the graphene. The nanoparticles may also be disposed over the substrate by contacting dry nanoparticles with the surface of the substrate. The nanoparticles may be uniformly distributed over the surface. According to one embodiment, the nanoparticles may be generated on the surface from the substrate during the initial sliding regime.

The graphene may be present on the substrate in a discontinuous layer. The graphene may have any appropriate density over the surface of the substrate. According to one embodiment, the density of the nanoparticles may be less than the density of the graphene patches present on the surface of the substrate. The graphene may cover at least about 25% of the substrate surface.

A non-limiting example was produced. The weight concentration of graphene in an ethanol solution was 1 mg/L, containing mostly single-layer graphene. A small SPG amount, 10-15 drops or 0.5-0.75 mL of solution per 1 $cm^2$, was applied on an $SiO_2$/Si wafer in a colloidal liquid state, and the liquid ethanol part was evaporated in dry nitrogen to reduce graphene oxidation. The procedure resulted in few-layer, 2-3 layers, graphene flakes partially covering the silicon dioxide substrate, with the flakes covering about 25% of the substrate. A small amount, 1 drop or 0.05 mL of solution per 10 $cm^2$, of diamond nanoparticles of 3-5 nm diameter in dimethyl sulfoxide (DMSO) solution with a concentration of 5 g/L was deposited on the substrate during the graphene deposition. Alternatively, when a nickel substrate was employed and no nanoparticles were provided during the deposition process, the initial sliding regime resulted in generation of Ni nanoparticles from the substrate.

The method of producing the low friction wear surface may provide energy and cost savings in comparison to pre-existing low friction wear coating processes. Additionally, the process of producing the low friction wear surface may be scaled to large areas.

The produced low friction wear surface may exhibit a COF of less than about 0.01 with diamond like carbon. According to one embodiment, the low friction wear surface may exhibit a COF of less than about 0.005, such as less than about 0.004 or less than about 0.003. The COF of the low friction wear surface may be below measurable levels.

Increased Wear Resistance of Graphene Wear Surface in Hydrogen

A unique tribological property of a graphene layer containing wear surface exposed to hydrogen has been observed. The wear resistance lifetime of graphene layer containing wear surfaces is influenced heavily by the wear environment.

Figure 17:
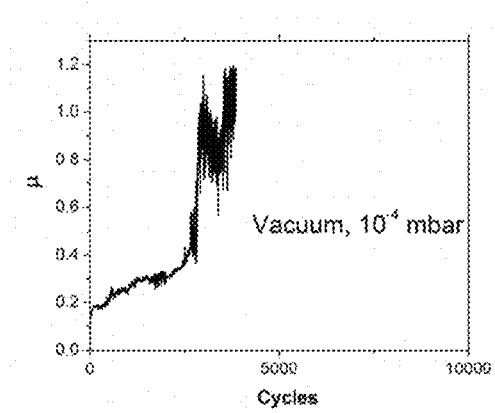
FIG. 17 depicts the coefficient of friction of a graphene layer as a function of test cycles in a vacuum environment in one embodiment.
Figure 18:
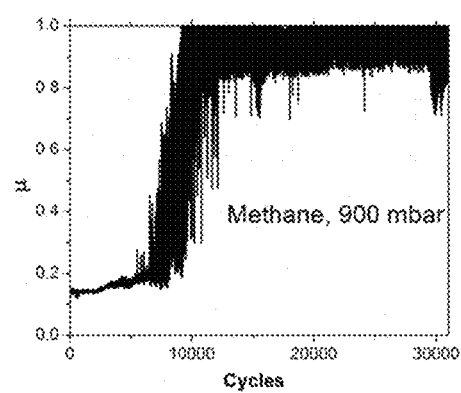
FIG. 18 depicts the coefficient of friction of a graphene layer as a function of test cycles in a methane environment in one embodiment.
Figure 19:
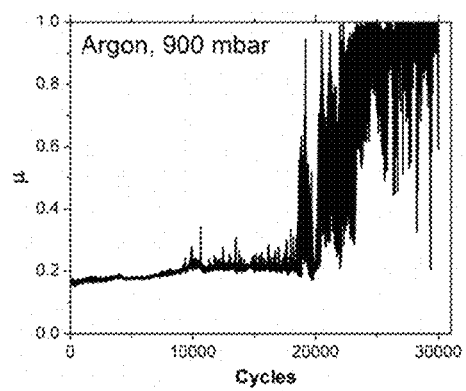
FIG. 19 depicts the coefficient of friction of a graphene layer as a function of test cycles in an argon environment in one embodiment.
Figure 20:
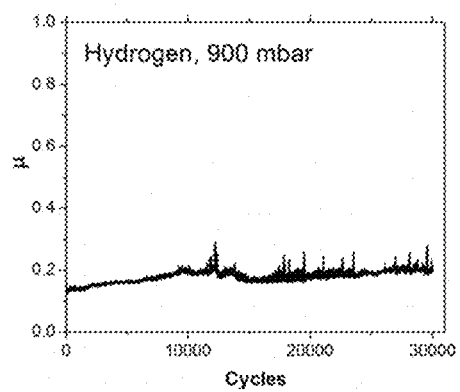
FIG. 20 depicts the coefficient of friction of a graphene layer as a function of test cycles in a hydrogen environment in one embodiment.

A multilayer graphene wear surface was subjected to lifetime testing in various atmospheres, such as vacuum, methane, argon and hydrogen. The wear surface tested in a $10^{-4}$ mbar vacuum exhibited a lifetime of about 3,000 cycles, as shown in FIG. 17. The wear surface in a 900 mbar methane environment exhibited a lifetime of about 7,000 cycles, as shown in FIG. 18. The wear surface in a 900 mbar argon environment exhibited a lifetime of about 20,000 cycles, as shown in FIG. 19. The wear surface in a 900 mbar hydrogen environment exhibited a lifetime of greater than about 30,000 cycles, as shown in FIG. 20. Thus, the same multilayer graphene wear surface exhibits a much longer lifetime in a hydrogen environment than the other testing environments.

Figures 21A, 21B:
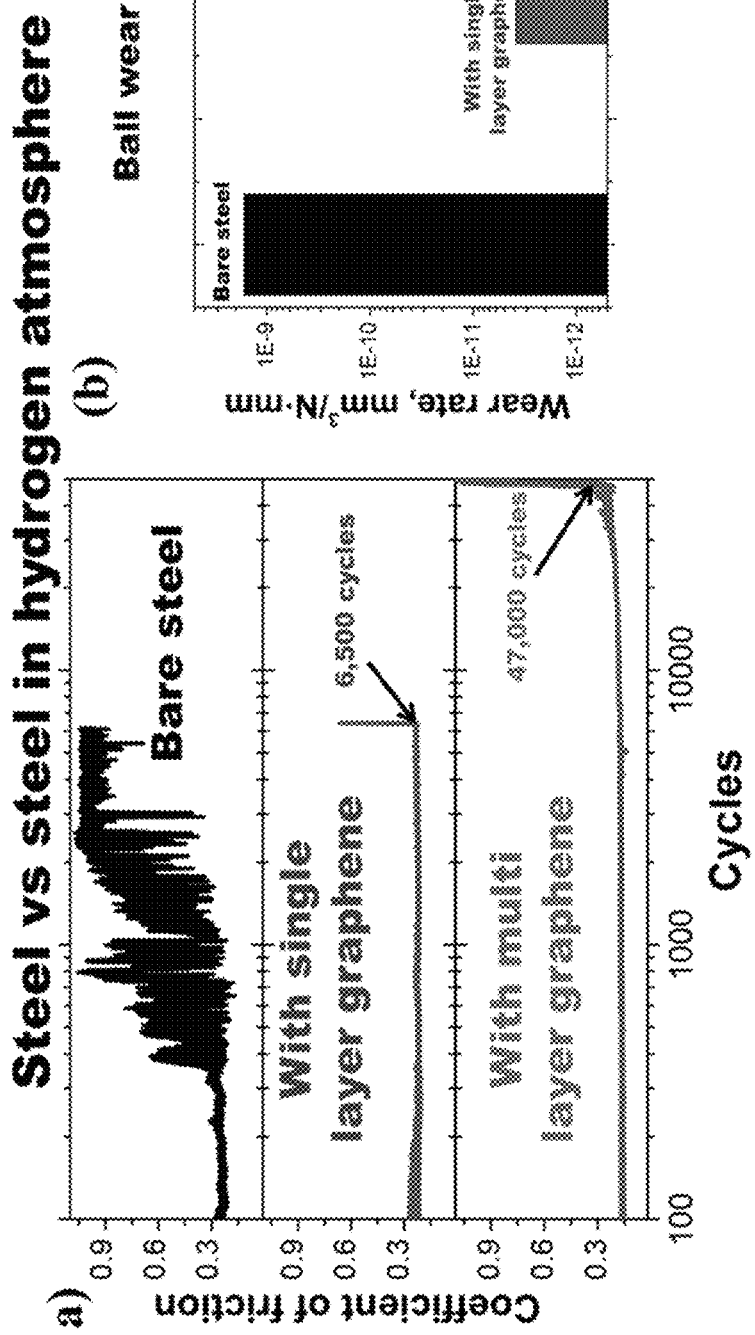
FIGS. 21(a) and 21(b) depict, respectively, the coefficient of friction as a function of cycles and ball wear rate for each of bare steel on steel, steel on steel with a single layer of graphene and steel on steel with multi-layer graphene in a hydrogen atmosphere in one embodiment.

The lifetime of a monolayer of graphene in hydrogen was observed to be more than 6,400 cycles despite a high contact pressure of 0.5 GPa between a steel ball and a steel disk. Additionally, 3D profile images of the rubbing surfaces of the steel disk demonstrate no evidence of any measurable wear. This indicates that the extraordinarily protective stability and wear resistance of graphene as a coating in hydrogen originates at the level of a single monolayer. As shown in FIGS. 21(a) and 21(b), even a one atom thick layer of graphene is sufficient to stop wear of rubbing disk surfaces and at the same time keep the coefficient of friction (COF) low, such as $\mu$, of about 0.22, for a time period greatly exceeding that of bare steel. The wearing out of the graphene layer is indicated by a sudden steep increase in friction.

FIG. 21(a) shows the coefficient of friction for single layer graphene in a hydrogen environment between two sliding steel interfaces is low and steady. The lifetime of this single layer of graphene is nearly 6,500 cycles when the test is performed in a 900 mbar hydrogen environment with an exceptionally low wear rate of the steel ball, as shown in FIG. 21(b). Multilayer graphene, such as 3-4 layer thick graphene flakes, allows the wear life to be further extended to 47,000 cycles with the wear rate of the steel ball reduced by almost 4 orders of magnitude in comparison to the bare steel. No measurable wear was observed on the steel disk. In the absence of graphene, a steel ball sliding against a steel disk in a hydrogen environment produces a coefficient of friction (COF) that increases almost immediately, such as within 300 cycles after starting the test, and stabilizes at a high value of about 1. This high friction leads to substantial amount of wear on rubbing surfaces of both the ball and disk side as shown in FIG. 21(b).

Figures 22A, 22B, 22C, 22D:
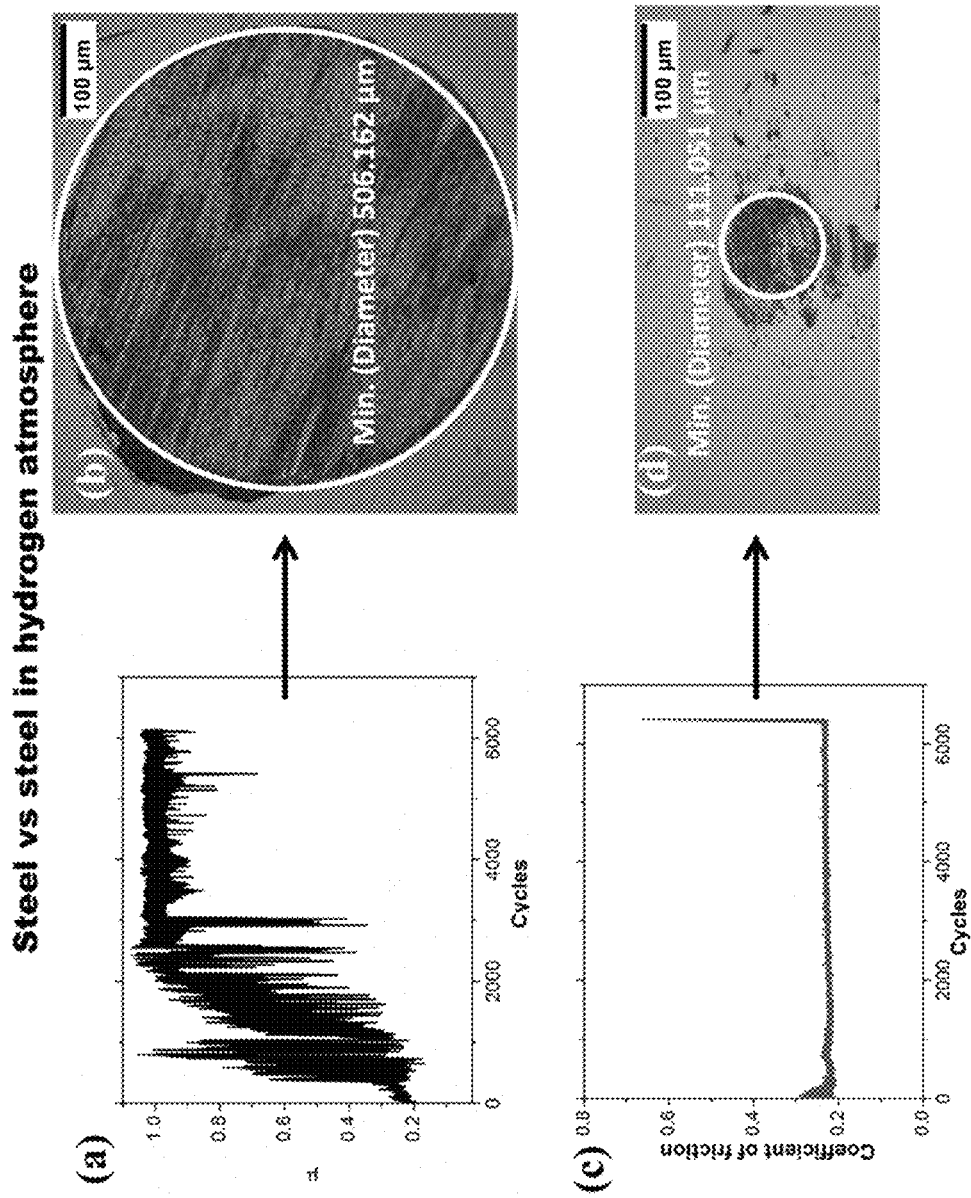
FIGS. 22(a)-(d) depict, respectively, the coefficient of friction as a function of cycles of bare steel on steel in a hydrogen atmosphere, the ball wear diameter of bare steel on steel in a hydrogen atmosphere, the coefficient of friction as a function of cycles of steel with a single layer of graphene on steel in a hydrogen atmosphere and the ball wear diameter of steel with a single layer of graphene on steel in a hydrogen atmosphere in one embodiment.

The wear mark on the ball after such a long test in a hydrogen environment in the presence of graphene is small and mostly identified by the Hertz contact diameter during sliding, which is about 60 μm for the test. The COF and ball wear diameter for steel sliding against bare steel in a hydrogen environment are shown in FIGS. 22(a) and 22(b), and the COF and ball wear diameter for steel sliding against steel with a single layer of graphene in a hydrogen environment are shown in FIGS. 22(c) and 22(d). Additionally, the steel ball wear rate with graphene in FIG. 21(b) may be overestimated as the ball's elastic deformation under such a high contact pressure was not taken in to account. Therefore, the actual reduction in the wear rate may be even more than the 4 orders of magnitude shown in FIG. 21(b).

Raman mapping of the wear track throughout a sliding test presents the evolution of the wear track coated with single graphene layer during the sliding process in the hydrogen environment, as shown in FIG. 23(a). The peak intensity of D at about 1360 $cm^{-1}$, G at about 1590 $cm^{-1}$, and 2D at about 2720 $cm^{-1}$ bands of graphene after an initial period of sliding (after 1,000 cycles), in the middle of sliding (after 4,000 cycles) and at the end of the tribological test (after 6,500 cycles) are shown in FIGS. 23(b), 23(c) and 23(d) respectively. During continuous sliding, the graphene layer gradually becomes damaged and disordered. The sliding process produces a decrease in the 2D peak intensity, indicating a loss of crystalline structure. Concurrently, the D-peak intensity increases, indicating a defective or disordered nature of the graphene layer which may be produced by a mechanical rubbing action. At the end of the test, after all the graphene is removed from the wear track, the 2D mapping indicates a carbon presence on the sides of the wear scar but no carbon presence within the wear scar.

The single layer graphene does not survive for the same period of time when subjected to a sliding test in a dry nitrogen environment, which is provided as a comparative example to demonstrate the unique effect of hydrogen in facilitating the extraordinary wear resistance of graphene. The coefficient of friction increases after several hundred cycles, indicating the removal of the graphene layer from the wear track, as shown in FIGS. 27(a) and 27(c). The ball wear rate in nitrogen is shown in FIG. 27(b). For multilayer graphene this lifetime in a nitrogen environment may be extended, although it still remains considerably shorter than for graphene in hydrogen environment.

Figures 24A, 24B, 24C, 24D, 24E, 24F:
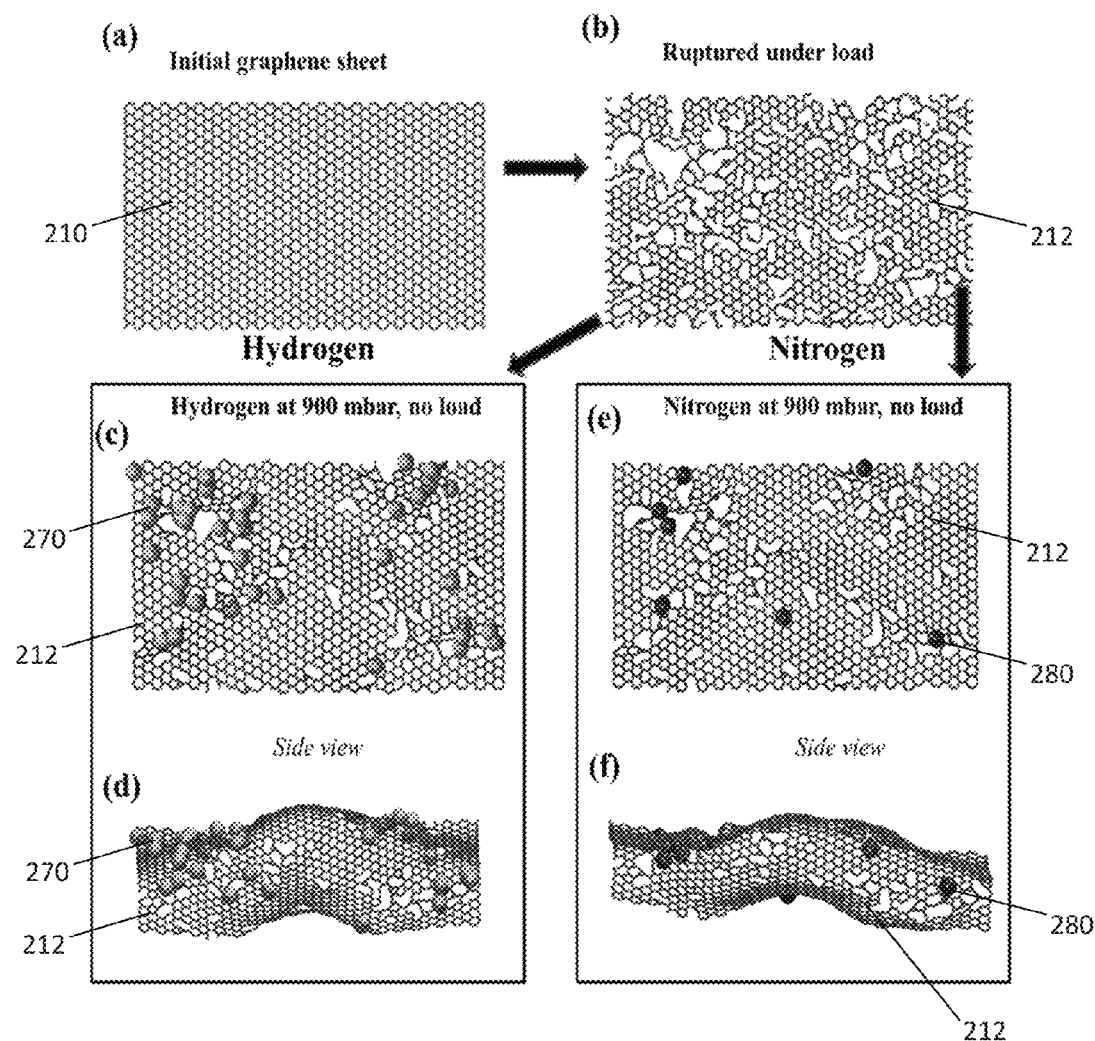
FIGS. 24(a)-(f) depict, respectively, schematic representations of an initial graphene sheet, a graphene sheet ruptured under 0.5 GPa load in a vacuum, the ruptured graphene sheet after exposure to hydrogen, a side view of the ruptured graphene sheet after exposure to hydrogen, the ruptured graphene sheet after exposure to nitrogen and a side view of the ruptured graphene sheet after exposure to nitrogen in one embodiment.
Figures 25A, 25B:
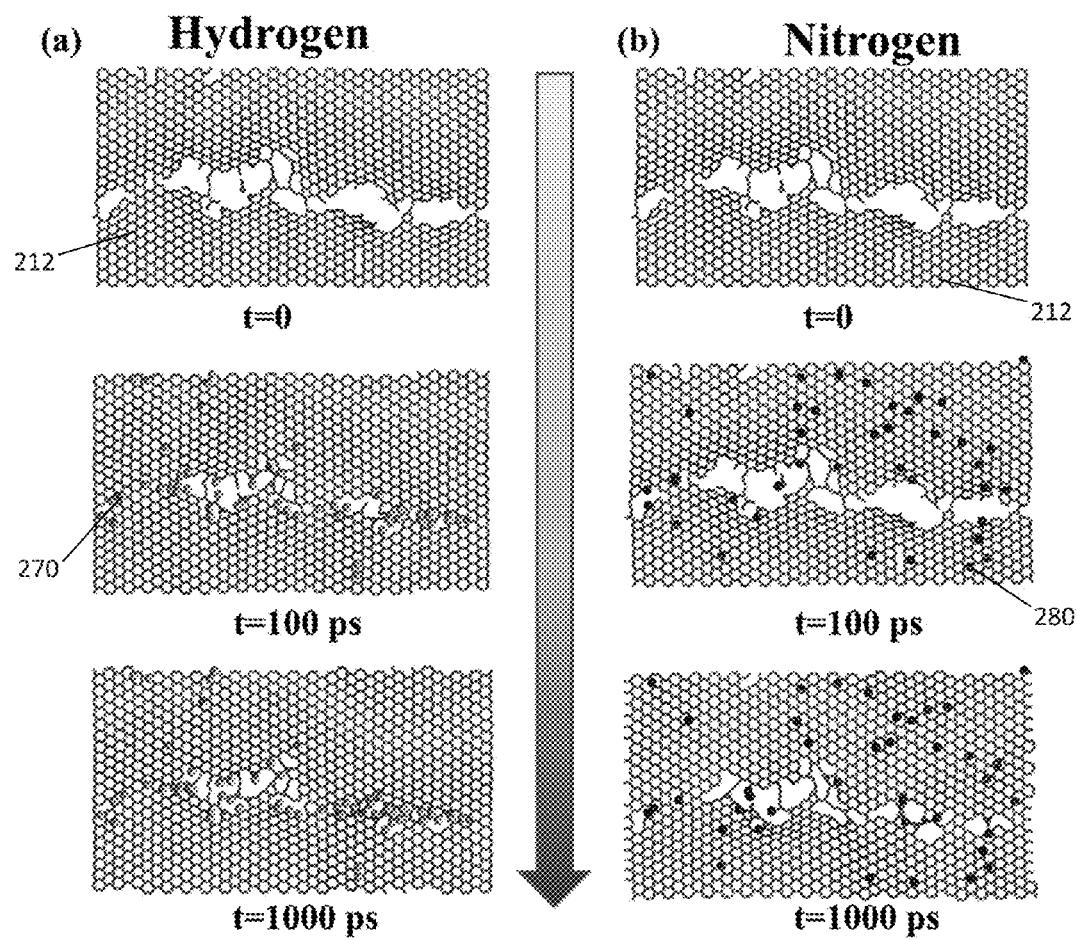
FIGS. 25(a) and 25(b) depict, respectively, schematic representations of a graphene sheet ruptured under 0.5 GPa load exposed to a hydrogen atmosphere and a nitrogen atmosphere at various exposure times in one embodiment.

To better understand the origin of the differences between the lifetime of graphene in hydrogen in comparison to nitrogen, reactive molecular dynamics (MD) simulations modeling atomistic interactions during graphene's sliding behavior in different gaseous environments under severe contact pressure were performed. The pristine graphene sheet 210 and the ruptured graphene sheet 212 after simulated sliding under severe contact pressure of about 0.5 GPa are shown in FIGS. 24(a) and 24(b), respectively. When this fractured and defective graphene sheet 212 is exposed to hydrogen, the hydrogen atoms 270 occupy the reactive carbon edges of the flakes, as shown in FIGS. 24(c) and 24(d). The hydrogen passivation may stabilize the defect sites on the graphene flake, protecting the underlying surface from further damage. In the case of a dry nitrogen atmosphere, almost no passivation or repair of torn or broken graphene monolayers occurs. Thus, the graphene experiences increasingly more fragmentation and loses its protective character upon cycling in a nitrogen environment. The simulations indicate that nitrogen gas 280 is mostly physisorbed and does not react with carbon atoms at the edges of the flakes, as shown in FIGS. 24(e) and 24(f). The dynamical evolution of the passivation effect by hydrogen can be seen in FIG. 25(a). The failure of nitrogen to stabilize the defect sites as, shown in FIG. 25(b), produces rapid disintegration of defective graphene under high contact pressure, and leads to formation of amorphous carbon.

Raman mapping of the wear track after the test in nitrogen indicates that carbon is still partially present at the wear track in the form of amorphous carbon, which does not protect the sliding steel interfaces from high friction and wear, as shown in FIG. 27(c). Graphene disintegration in nitrogen may result in the exposure of bare steel surface area to the sliding contact and produce higher friction and wear. The above scenario also holds true under conditions of low load when graphene defects are randomly distributed.

The effect of hydrogen may be twofold. First, hydrogen may react with and remove an excess of oxygen from the substrate surfaces, thus suppressing oxide formation. For example, hydrogen may react with and remove an excess of oxygen from steel surfaces, thus suppressing iron oxide formation. Second, when and if the graphene layer is damaged or ruptured, hydrogen may instantly passivate the dangling carbon bonds on the ruptured graphene, stabilizing the atomic array of graphene by forming covalent C—H bonds at the ruptured edges. The breaking and formation of bonds may be energetically favored due to the high contact pressures at the sliding interface. The simulation results indicate one possible scenario in which hydrogen passivation extends the lifetime of graphene within the wear track. Other scenarios may also exist. For example, an improved tribological performance of hydrogenated graphene was predicted by density functional theory (DFT) simulations, which attributed the observed frictional improvement to electronic contributions. Other possibilities also exist, including hydrogen induced formation of $sp^3$-like clusters shown theoretically where interaction of hydrogen with multilayer graphene can induce formation of $sp^3$-like clusters through a domino effect. Formation of an extremely thin $sp^3$ rich layer could also potentially increase the wear resistance.

Indirect evidence for graphene chemically bonded to hydrogen at the edges is provided by the Raman analysis shown in FIG. 23($a$). The prominent D band and the appearance of the D' and D+D' bands are generally related to point defects in the basal plane or edges of single-crystalline graphene domains. The D' peak, at about 1630 $cm^{-1}$, is much more pronounced in the case of vacancy-type defects, producing a lower $I_D/I_{D'}$ ratio of about 4. In the case of primarily $sp^3$ defects, the $I_D/I_{D'}$ ratio reaches about 13. The Raman spectra for the wear track after 4,000 cycles in a hydrogen environment, as shown in FIG. 23($a$), indicates a high intensity ratio of $I_D/I_{D'}$ of about 12, which corresponds to defects primarily arising from $sp^3$ bonds. The $sp^3$ type defects may result from the formation of C—H bonds. Raman analysis of the wear tracks after the COF increase in a nitrogen environment indicates the formation of amorphous carbon with a $I_D/I_G$ of about 2, in comparison to a $I_D/I_G$ of about 0.5 for a hydrogen environment. This result corresponds to a higher $sp^2/sp^3$ ratio in the case of a nitrogen atmosphere than the $sp^2/sp^3$ ratio for a hydrogen environment.

The wear resistance, and associated lifetime, of a wear surface including graphene may be increased by a process including providing hydrogen to the wear surface. The hydrogen may be provided to the wear surface concurrently with or after the wear surface is subjected to wear. In the case that the hydrogen is provided to the wear surface after the wear surface is subjected to wear, the hydrogen may be provided periodically at pre-determined intervals or before the wear surface is subjected to additional wear.

The hydrogen may be provided to the wear surface by any suitable mechanism. According to one embodiment, the hydrogen is provided to the wear surface by establishing a hydrogen environment over the wear surface. Alternatively, the hydrogen may be provided to the wear surface by flowing hydrogen over the wear surface, such as flowing hydrogen from a hydrogen supply or a local hydrogen reservoir. The flowing hydrogen may be directed by one or more gas jets arranged such that the flowing hydrogen contacts the wear surface. According to another embodiment, the hydrogen may be supplied to the wear surface in a liquid medium.

The process of increasing wear resistance and associated lifetime may additionally include the disposition of the graphene layer over the substrate surface. A single layer of graphene may be disposed over the substrate surface by placing a single layer graphene film on the substrate surface. The disposition of the single layer of graphene may include the growth of a graphene layer on a metal foil, disposing a protective polymer layer on the grown graphene layer, removing the metal foil, placing the graphene layer on the surface of the substrate and removing the protective polymer layer. A multilayer graphene layer may be disposed over the substrate surface by a solution processed graphene (SPG) process. The SPG process may include the chemical or mechanical exfoliation of graphite, disposing the resulting graphene flakes in a liquid solvent, spraying the liquid solution on the surface of the substrate, and evaporating the liquid of the solution to produce a multilayer graphene layer.

The produced wear resistant surface including a single graphene layer on a substrate may exhibit a lifetime of at least about 6,400 cycles of sliding contact with a steel ball at a pressure of about 0.3 GPa. The produced wear resistant surface including multiple graphene layers on a substrate may exhibit a lifetime of at least about 47,000 cycles of sliding contact with a steel ball at a pressure of about 0.3 GPa.

The substrate may be any suitable material. According to one embodiment the substrate may include at least one of a metal, a transition metal and an insulator. The substrate may include steel. According to one embodiment, the substrate may include titanium, aluminum, copper, molybdenum, tungsten, gold, tin, iron, or alloys thereof.

The combination of the low friction and long lifetime of the graphene containing wear surface have not been previously achieved. For example, pre-existing solid lubricants do not exhibit the lifetime achieved by the wear surface in hydrogen at thicknesses comparable to a few layers of graphene. The simple process of producing the wear surface provides energy and cost savings in comparison to pre-existing solid lubricant materials. For example, the method of producing the wear surface does not require the heating of the substrate to produce the graphene layer. The long lifetime wear surface may be included in devices in which a thin, low friction and long lifetime coating is beneficial.

The majority of the tribological tests were conducted on single layer graphene between two sliding steel interfaces. FIG. 26($a$) depicts a test arrangement include a steel ball 200 and a single layer graphene 210 on a steel substrate 250. The Raman spectrum for the single layer graphene is shown in FIG. 26($b$). The single layer graphene film was grown on a copper foil using a chemical vapor deposition (CVD) method. The thickness of the as-grown graphene was measured with Raman Spectroscopy. After deposition, the graphene layer is removed from one side of the copper foil using an oxygen plasma reactive ion etching (RIE) procedure. To provide a mechanical support to the graphene during the transfer process, an about 300 nm thick poly (methyl methacrylate) (PMMA) protective layer is employed. The Cu foil was then removed by etching with ammonium persulfate (0.1 M) and the PMMA/graphene film was rinsed in distilled water and placed on a stainless steel (440C grade) substrate with a rms roughness ($R_q$) of 20 nm. The PMMA protective layer was then removed using acetone, producing single layer graphene on flat steel substrate. That there was no left-over PMMA on the surface and was confirmed by extensive Raman mapping of the surface.

In the case of a multilayer graphene coating on the steel surface, graphene multilayer flakes were deposited on a steel substrate from a graphene containing ethanol solution, and then the ethanol is evaporated in a dry nitrogen flow. The multilayer graphene test arrangement including a steel ball 200, a steel substrate 250 and a multilayer graphene film 214 is schematically depicted in FIG. 26(c). The Raman spectrum for the multilayer graphene is shown in FIG. 26(d). The solution processed graphene (SPG) was prepared by chemical exfoliation of highly oriented pyrolytic graphite (HOPG) and was then suspended in ethanol. The weight concentration of graphene in the solution was 1 mg/L, and the solution contained mostly single layer graphene. A small amount of SPG, such as 10-15 drops or 0.5-0.75 mL of solution per 1 cm$^2$, was applied on the highly polished surfaces of stainless steel plates in a colloidal liquid state, and the liquid ethanol part was evaporated in dry nitrogen environment to reduce graphene oxidation. The procedure resulted in multilayer, such as about 3-4 layers, graphene flakes disposed on the steel substrate, with the graphene flakes covering about 25% of the surface of the substrate.

The sliding counterpart in the tribological tests was a stainless steel ball (440C grade) of 9.5 mm diameter with a rms roughness ($R_q$) of 15 nm, as measured by a 3D profilometer.

Macro-scale tribological tests were performed in dry hydrogen (900 mbar) and dry nitrogen (900 mbar) environments at room temperature using a CSM tribometer with a ball-on-disk contact geometry. The normal load during the tribotests was 1 N (Hertz contact pressure of 0.33 GPa) at a speed of 60 rpm, and the radius of the wear track varied from 5 mm up to 15 mm with a linear speed varied from 3 cm/s up to 9 cm/s.

The tribotest performed in hydrogen environment, when the single layer of graphene is present, is mostly identified by the Hertz contact diameter during sliding, which is ~60 μm for the test.

The assessment of the wear volume of flat was very difficult as wear was manifested as deep scratches and could not be fit into a reliable wear equation. To estimate the wear volume for the balls after the tribo tests, we used the following equation:

$$V = \left(\frac{\pi h}{6}\right)\left(\frac{3d^2}{4} + h^2\right)$$

where d is wear scar diameter and r is the radius of the ball and $$h = r - \sqrt{r^2 - \frac{d^2}{4}}.$$

The imaging of the wear scars was performed with an Olympus UC30 microscope. The wear rates on the ball and the flat substrate were determined with a 3D non-contact MicroXam profilometer.

Characterization of deposited graphene layer and wear debris after the tribotests is performed by an Invia Confocal Raman Microscope using blue laser light (λ=442 nm). The accumulation time for each spectrum in the single scan mode and for the mapping was 10 s.

Reactive molecular dynamics (MD) simulations with dynamic charge transfer between atoms was used to investigate the effect of gas phase environment on the fracture and passivation mechanisms under GPa loads. To simulate the graphene interaction with a hydrogen and a nitrogen environment after a wear cycle, a reactive force-field (ReaxFF) potential model that allows for variable and dynamic charge transfer between atoms was employed. In particular, ReaxFF implements quantum chemistry calculations, including molecular association/dissociation and charge transfer between cations and anions, and therefore produces a more accurate description of the oxidation simulation. By calculating many-body interactions of a single particle, characteristics of the quantum chemistry effect are employed in multiple-components of particle interactions, such as bond energy, over/under coordination, lone-pair energy, valence angle, torsion, hydrogen bond, van der Waals, and Coulomb, as shown in the following equation:

$$E_{total} = E_{bond} + E_{over} + E_{under} + E_{lp} + E_{val} + E_{tors} + E_H + E_{vdw} + E_{Coul}.$$

Additionally, the temporal charges of cations/anions were calculated using the electro-negativity equalization method as shown in the following equation $$E(q) = \sum_i \left[ \chi_i q_i + \eta_i q_i^2 + \text{Tap}(r_{ij}) k_c \frac{q_i q_j}{(r_{ij}^3 + \gamma_{ij}^{-3})^{1/3}} \right].$$

In the above equation, q, χ, η, Tap(r), γ, and $k_C$ are the ion charge, electro-negativity, atomic hardness, 7th order taper function, shielding parameter, and dielectric constant, respectively. The simulation is capable of treating both metallic and ceramic systems as well as bond formation and bond breakage involved in the graphene nucleation and growth processes. Additionally, the simulation takes into account the presence of multiple coordination and valence states when the graphene film interacts with hydrogen and/or nitrogen.

The dynamical evolution leading to the fracture of the graphene sheet when subjected to wear and the subsequent exposure of the fractured graphene sheet to hydrogen and nitrogen environments is captured using the ReaxFF potential model. The simulation cell comprised a graphene sheet with dimensions of about 52 Å by about 92 Å. About 100,000 MD steps using isokinetic MD were performed to equilibrate the graphene sheet. The temperature was maintained at a constant 300 K using a Nose-Hoover thermostat. The equilibrated samples were then simulated in a NVT ensemble for 1 ps with dynamic charge transfer using the ReaxFF potential model to generate the final 300 K relaxed configuration. The graphene sheet was then subjected to a surface normal load in the 0.01 to 0.13 Kcal/mole-Angstrom range per atom. The fracture of the graphene sheet and its dynamical evolution under the applied loads was simulated over a period of 5 ns with a 0.25 fs timestep. To facilitate comparisons with the experiments and understand the mechanism of differential wear resistance under the two gas environments, the interactions of this fractured graphene with hydrogen and nitrogen environments were performed. The hydrogen atmosphere was created by introducing 500 hydrogen atoms in the simulation box with randomly chosen x, y, and z positions. In the case of simulations in the hydrogen environment, reflecting boundary conditions were imposed in the z-direction to confine the molecules that might reach the simulation box limit. The procedure was repeated to simulate the effect of the nitrogen gas environment on the fractured graphene sheets. The gas pressure was thus maintained constant during these simulations. In all the simulations, the atomic velocities were chosen from a Maxwell-Boltzmann distribution corresponding to the desired temperature. The equations of motion were integrated using a leapfrog scheme with time steps of 1 fs. The charge relaxation procedure used to minimize the electrostatic energy subject to the electro-neutrality principle was very time consuming. Thus, the atomic charges were updated every $10^{th}$ MD step. The influence of a more frequent charge update was found to have no influence on the observed simulation results. The simulations were carried out using the Large-scale Atomic/Molecular Massively Parallel Simulator (LAMPPS).

The low friction surfaces and wear resistant surfaces disclosed herein may be included in any device where low friction or wear resistance is desired. For example, the low friction surfaces and wear resistant surfaces disclosed herein may be employed in devices including: bearings, molds, razor blades, wind turbines, gun barrels, gas compressors, fuel cells, artificial hip joints, artificial knee joints, magnetic storage disks, scratch-free monitors, scratch-resistant monitors, televisions, barcode scanners, solar panels, watches, mobile phones, computers and electrical connectors. For example, the low friction surfaces and wear resistant surfaces may be present on electrical connectors that are included in microelectromechanical systems (MEMS) or nanoelectromechanical systems (NEMS).

Additional Notes

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." Any ranges cited herein are inclusive.

The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed:

1. A low friction wear surface comprising:
   a substrate;
   graphene disposed over the substrate; and
   a plurality of nanoparticles consisting essentially of a material selected from the group consisting of nickel and diamond disposed over the the graphene;
   a plurality of graphene scrolls formed on the substrate, at least a portion of the plurality of graphene scrolls having a nanoparticle of the plurality of nanoparticles disposed therein.

2. The low friction wear surface of claim 1, wherein the substrate comprises a material selected from the group consisting of a metal, a transition metal and an insulator.

3. The low friction wear surface of claim 1, wherein the substrate comprises at least a portion of a bearing, mold, razor blade, wind turbine, gun barrel, gas compressor, fuel cell, artificial hip joint, artificial knee joint, magnetic storage disk, scratch-free monitor, scratch-resistant monitor, television, barcode scanner, solar panel, watch, mobile phone, computer or electrical connector.

4. The low friction wear surface of claim 1, wherein the low friction wear surface has a coefficient of friction of less than about 0.01 with diamond like carbon.

5. The low friction wear surface of claim 1 further comprising a diamond like carbon layer in contact with the plurality of graphene scrolls.

6. A wear resistant surface comprising:
   a substrate, and
   a graphene layer disposed over the substrate, the graphene layer having a plurality of defect sites;
   hydrogen bonded to exposed carbon edges of the defect sites;
   wherein the bonded hydrogen passivates the defect sites.

7. The wear resistant surface of claim 6, wherein the graphene layer is a single graphene layer.

8. The wear resistant surface of claim 6, wherein the wear resistant layer has a lifetime of at least about 6,400 cycles of sliding contact with a steel ball at a pressure of about 0.3 GPa and the substrate comprises steel.

9. The wear resistant surface of claim 6, wherein the graphene layer comprises multiple graphene layers.

10. The wear resistant surface of claim 9, wherein the wear resistant layer has a lifetime of at least about 47,000 cycles of sliding contact with a steel ball at a pressure of about 0.3 GPa and the substrate comprises steel.

11. The wear resistant surface of claim 6, wherein the substrate comprises at least a portion of a bearing, mold, razor blade, wind turbine, gun barrel, gas compressor, fuel cell, artificial hip joint, artificial knee joint, magnetic storage disk, scratch-free monitor, scratch-resistant monitor, television, barcode scanner, solar panel, watch, mobile phone, computer or electrical connector.

12. The wear resistant surface of claim 6, wherein the wear resistant surface comprises molecular hydrogen bonded only to the exposed carbon edges of the defect sites.

* * * * *